(12) United States Patent
Sigtermans et al.

(10) Patent No.: US 11,543,814 B2
(45) Date of Patent: Jan. 3, 2023

(54) METHODS OF MODELLING SYSTEMS OR PERFORMING PREDICTIVE MAINTENANCE OF LITHOGRAPHIC SYSTEMS

(71) Applicant: ASML NETHERLANDS B.V., Veldhoven (NL)

(72) Inventors: David Evert Song Kook Sigtermans, Veldhoven (NL); René Fussenich, Valkenswaard (NL); Adam Marek Kielczewski, San Diego, CA (US); Errol Arthur Zalmijn, Malden (NL); Marcel Richard André Brunt, Veldhoven (NL); Stefan Lucian Voinea, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 1030 days.

(21) Appl. No.: 15/760,228

(22) PCT Filed: Sep. 13, 2016

(86) PCT No.: PCT/EP2016/071519
§ 371 (c)(1),
(2) Date: Mar. 14, 2018

(87) PCT Pub. No.: WO2017/055073
PCT Pub. Date: Apr. 6, 2017

(65) Prior Publication Data
US 2018/0267523 A1 Sep. 20, 2018

Related U.S. Application Data

(60) Provisional application No. 62/358,485, filed on Jul. 5, 2016, provisional application No. 62/253,608, filed (Continued)

(51) Int. Cl.
*G05B 23/02* (2006.01)
*G06F 11/07* (2006.01)
*G03F 7/20* (2006.01)

(52) U.S. Cl.
CPC ..... *G05B 23/0283* (2013.01); *G03F 7/70508* (2013.01); *G03F 7/70525* (2013.01);
(Continued)

(58) Field of Classification Search
None
See application file for complete search history.

(56) References Cited

U.S. PATENT DOCUMENTS 5,969,973 A * 10/1999 Bourne ............ G05B 19/41825
700/165
2004/0015329 A1 * 1/2004 Shayegan ............... G09B 23/28
702/179

(Continued)

FOREIGN PATENT DOCUMENTS

WO 2008-077497 7/2008
WO 2014-160388 10/2014
WO 2015/122362 8/2015

OTHER PUBLICATIONS

Richardson, "A Discovery Algorithm for Directed Cyclic Graphs", Aug. 1996, Morgan Kaufmann Publishers Inc, pp. 454-455 (Year : 1996).*

(Continued)

*Primary Examiner* — Mohammad Ali
*Assistant Examiner* — David Earl Ogg
(74) *Attorney, Agent, or Firm* — Pillsbury Winthrop Shaw Pittman, LLP

(57) ABSTRACT

Predictive maintenance methods and systems, including a method of applying transfer entropy techniques to find a causal link between parameters; a method of applying (Continued)

quality weighting to context data based on a priori knowledge of the accuracy of the context data; a method of detecting a maintenance action from parameter data by detecting a step and a process capability improvement; a method of managing unattended alerts by considering cost/benefit of attending to one or more alerts over time and assigning alert expiry time and/or ranking the alerts accordingly; a method of displaying components of a complex system in a functional way enabling improvements in system diagnostics; a method of determining the time of an event indicator in time series parameter data; a method of classifying an event associated with a fault condition occurring within a system; and a method of determining whether an event recorded in parameter data is attributable to an external factor.

20 Claims, 8 Drawing Sheets

Related U.S. Application Data on Nov. 10, 2015, provisional application No. 62/234,459, filed on Sep. 29, 2015.

(52) U.S. Cl.
CPC ..... *G05B 23/0221* (2013.01); *G05B 23/0243* (2013.01); *G06F 11/079* (2013.01)

(56) References Cited

U.S. PATENT DOCUMENTS

| | | | |
|---|---|---|---|
| 2007/0011113 A1* | 1/2007 | Mosleh | G06N 7/005 706/14 |
| 2007/0112707 A1* | 5/2007 | Meng | G06N 3/08 706/25 |
| 2007/0168341 A1* | 7/2007 | Nichols | G06F 16/2477 |
| 2013/0135600 A1* | 5/2013 | Middlebrooks | G03F 7/70641 355/67 |
| 2014/0279797 A1* | 9/2014 | Dang | G06N 5/046 706/47 |
| 2015/0106324 A1* | 4/2015 | Puri | G06F 11/0751 706/52 |
| 2017/0075749 A1* | 3/2017 | Ambichl | G06F 11/0748 |
| 2017/0220937 A1* | 8/2017 | Wada | G06K 9/00 |

OTHER PUBLICATIONS

Taiwanese Office Action issued in corresponding Taiwanese Application No. 105131408, dated May 2, 2018, with English translation, 11 pages.

International Search Report and Written Opinion dated Jan. 20, 2017 in corresponding International Patent Application No. PCT/EP2016/071519.

Ahmed, Faghraoui et al., "Data-driven causality digraph modeling of large-scale complex system based on transfer entropy", 2014 IEEE Conference on Control Applications (CCA), IEEE, pp. 705-710 (2014).

Schreiber, Thomas, "Measuring Information Transfer", Physical Review Letters, vol. 85, No. 2, pp. 461-465 (2000).

* cited by examiner

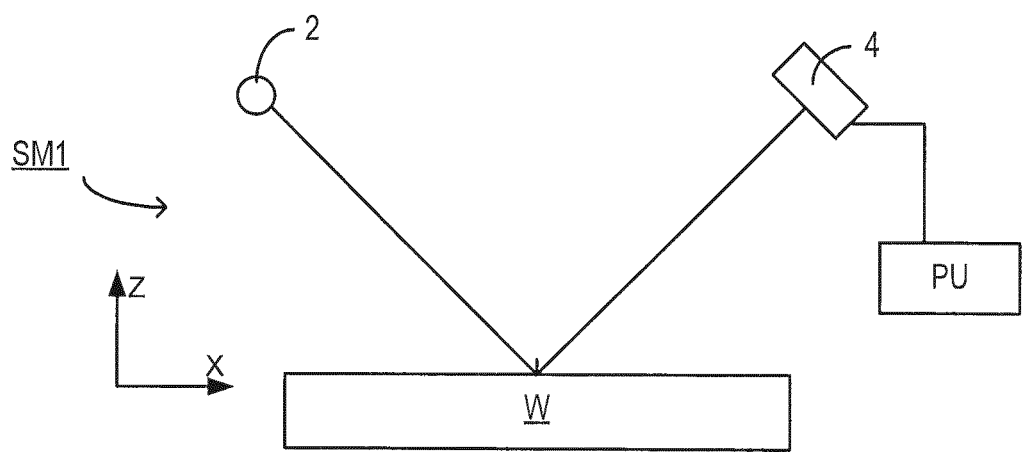
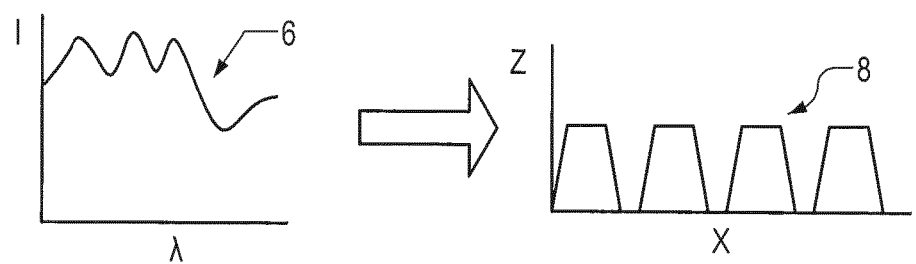
Fig. 3

METHODS OF MODELLING SYSTEMS OR PERFORMING PREDICTIVE MAINTENANCE OF LITHOGRAPHIC SYSTEMS

CROSS-REFERENCE TO RELATED APPLICATIONS

This application is the U.S. national phase entry of PCT patent application no. PCT/EP2016/071519, which was filed on Sep. 13, 2016, which claims the benefit of priority of U.S. provisional application No. 62/234,459, which was filed on Sep. 29, 2015 and U.S. provisional application No. 62/253,608, which was filed on Nov. 10, 2015 and U.S. provisional application No. 62/358,485 which was filed on Jul. 5, 2016, each of which is incorporated herein in its entirety by reference.

FIELD

The present description relates to predictive maintenance of systems generally and to methods for modelling such systems. More specifically, the present description relates to systems and techniques that are used to measure, inspect, characterize, simulate and/or evaluate the performance of lithographic systems and techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

SUMMARY

It is desirable to model operation of lithographic systems or apparatuses (or systems in general). This may comprise monitoring parameter values of the lithographic system and making predictions of future performance or events based on these parameter values using a model of the system operation. The disclosure herein describes a number of proposals for addressing issues relating to such predictive maintenance of lithographic systems, or systems in general.

In an aspect, there is provided a method of identifying causal relationships between pairs of time series, each pair of time series corresponding to a different pair of parameters of a lithographic apparatus, each time series comprising multiple samples of a different one of the parameters, the method comprising: determining a value for transfer entropy for each of the pairs of time series; and using the values for transfer entropy to identify causal relationships between the pairs of time series.

In an aspect, there is provided a method of modelling a system and/or process, the method comprising: obtaining parameter data relating to the system and/or process; determining context data relating to a context in which the system and/or process is operating from the parameter data, wherein the system and/or process is operable in at least one of a plurality of contexts at any one time; and applying a quality weighting to the context data, the quality weighting being dependent upon a measure of the accuracy of the context data for a particular context segment, each context segment comprising a segment of one of the contexts, wherein each context is segmented temporally.

In an aspect, there is provided a method of monitoring a system and/or process, the method comprising: monitoring one or more system and/or process parameter values over time; determining whether there is a step in the one or more system and/or process parameter values; responsive to such a step being detected, determining whether there is an increase in process capability subsequent to the step; and responsive to an increase in process capability being detected subsequent to a step, attributing this to a maintenance action having been performed on the system and/or process.

In an aspect, there is provided a method of management of unattended alerts generated by a model, the model modelling a system and/or process, the method comprising: obtaining a cost metric relating to a measure of a cost of attending to each alert generated; obtaining a benefit metric relating to a measure of a benefit in attending to each alert generated as a function of time; and performing a management action on the unattended alerts based on an evaluation of the benefit metric against the cost metric for each alert.

In an aspect, there is provided a method of representing a system, the method comprising: showing elements of the system and the relationships between the elements; showing, for at least some of the elements, properties which affect operation of that element; and showing, for at least some of the relationships between the elements, parameters relevant to that relationship.

In an aspect, there is provided a lithographic apparatus comprising: an illumination optical system arranged to illuminate a pattern; and a projection optical system arranged to project an image of the pattern onto a substrate, wherein the lithographic apparatus is arranged to perform a method as described herein to model operation of the lithographic apparatus, and wherein parameter data and context data relates to the lithographic apparatus.

In an aspect, there is provided a lithographic apparatus comprising: an illumination optical system arranged to illuminate a pattern; and a projection optical system arranged to project an image of the pattern onto a substrate, wherein the lithographic apparatus is arranged to perform a method as described herein to monitor operation of the lithographic apparatus, the system and/or process comprising the lithographic apparatus, wherein system and/or process parameters data comprise parameters of the lithographic apparatus.

In an aspect, there is provided a lithographic apparatus comprising: an illumination optical system arranged to illuminate a pattern; and a projection optical system arranged to project an image of the pattern onto a substrate, wherein the lithographic apparatus is arranged to run a model modelling its own operation, and perform a method as described herein to manage unattended alerts generated by the model.

In an aspect, there is provided a lithographic apparatus comprising: an illumination optical system arranged to illuminate a pattern; and a projection optical system arranged to project an image of the pattern onto a substrate, wherein the lithographic apparatus is arranged to identify causal relationships between pairs of time series, each pair of time series corresponding to a different pair of parameters of the lithographic apparatus, by performing a method as described herein.

In an aspect, there is provided a method of manufacturing devices wherein a device pattern is applied to a series of substrates using a lithographic process, the method comprising: using a method as described herein to identify causal relationships between pairs of time series, each pair of time series corresponding to a different pair of parameters of the lithographic process.

In an aspect, there is provided a method of manufacturing devices wherein a device pattern is applied to a series of substrates using a lithographic process, the method comprising: using a method as described herein to model the lithographic process, and using an output of the model to control the lithographic process.

In an aspect, there is provided a method of manufacturing devices wherein a device pattern is applied to a series of substrates using a lithographic process, the method comprising: using a method as described herein to monitor the lithographic process.

In an aspect, there is provided a method of manufacturing devices wherein a device pattern is applied to a series of substrates using a lithographic process, the method comprising: using a method as described herein to manage unattended alerts generated by a model of the lithographic process, and using an output of the model to control the lithographic process.

In an aspect, there is provided a method of determining whether an event recorded in parameter data is attributable to an external factor, the method comprising: obtaining plural equivalent sets of parameter data, the equivalent sets of parameter data being each obtained from equivalent sensors of different apparatuses within a same location and over the same time period; combining the equivalent sets of parameter data; determining whether there are coincident event indicators in the equivalent sets of parameter data; and attributing events as being caused by an external factor if there are coincident event indicators in a threshold number of equivalent sets of parameter data.

In an aspect, there is provided a method of determining the time of an event indicator in time series parameter data, the method comprising: applying a causal filter to the time series parameter data to obtain first filtered time series data; applying an anti-causal filter to the time series parameter data to obtain second filtered time series data; and combining the first filtered time series data and the second filtered time series data to determine a corrected time for an event indicator within the parameter data.

In an aspect, there is provided a lithographic apparatus comprising: an illumination optical system arranged to illuminate a pattern; and a projection optical system arranged to project an image of the pattern onto a substrate, wherein the lithographic apparatus is configured to run a model modelling its own operation, and perform a method as described herein to determine the time of an event indicator in time series parameter data related to the model.

In an aspect, there is provided a plurality of lithographic apparatuses; and a controller configured to perform a method as described herein using equivalent sets of parameter data, wherein each set of the equivalent sets of parameter data is generated from one of the lithographic apparatuses.

In an aspect, there is provided a method of manufacturing devices wherein a device pattern is applied to a series of substrates using a lithographic process performed on a plurality of lithographic apparatuses, the method comprising: using a method as described herein to determine whether an event recorded in parameter data is attributable to an external factor, and using the determination to control the lithographic process.

In an aspect, there is provided a method of manufacturing devices wherein a device pattern is applied to a series of substrates using a lithographic process, the method comprising: running a model modelling operation of the lithographic process; and performing a method as described herein to determine the time of an event indicator in time series parameter data related to the model.

In an aspect, there is provided a method of classifying an event associated with a fault condition occurring within a system, the method comprising: determining causal relationships between a plurality of events associated with the system; identifying one or more directed cycles within the plurality of events and the causal relationships; classifying a directed cycle based on a nominal system behavior; and classifying one or more event(s) having a causal relation to the classified directed cycle based on the cycle classification.

In an aspect, there is provided a computer program product comprising machine-readable instructions for causing a processor to perform a method as described herein.

Further features and advantages, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments will now be described, by way of example only, with reference to the accompanying schematic drawings in which corresponding reference symbols indicate corresponding parts, and in which:

FIG. 3 illustrates the principles of operation of a spectroscopic scatterometer as an example of an inspection apparatus;

DETAILED DESCRIPTION

Before describing embodiments in detail, it is instructive to present an example environment in which embodiments described herein may be implemented.

Figure 1:
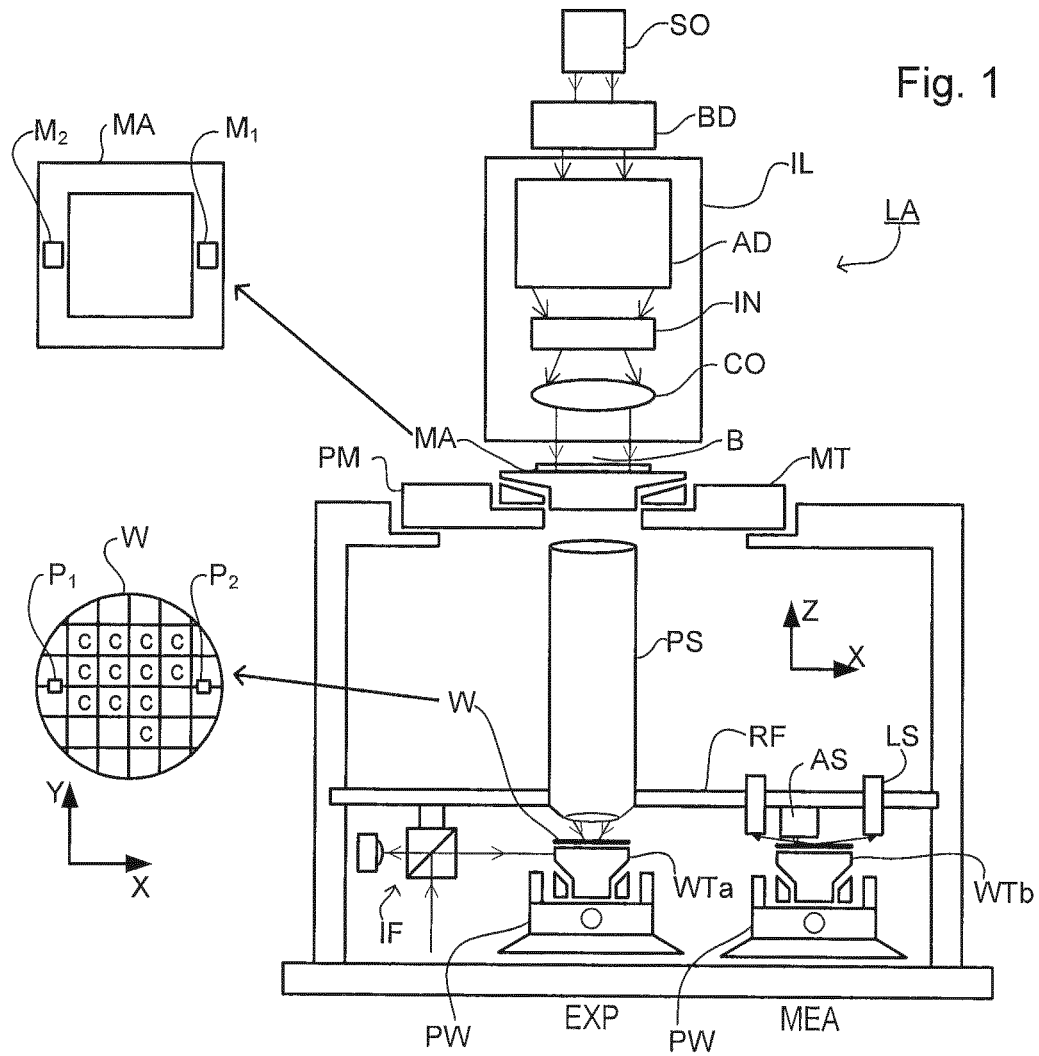
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can take many forms. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., reticle/mask) MA with respect to the path of the radiation beam B, e.g., after mechanical retrieval from a mask library, or during a scan.

Patterning device (e.g., reticle/mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. A small alignment mark may also be included within dies, in amongst the device features, in which case it is desirable that the markers be as small as possible and not require any different imaging or process conditions than adjacent features. The alignment system, which detects the alignment markers, is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has tables WTa, WTb (e.g., substrate tables or a substrate table and a measurement table) and two stations—an exposure station EXP and a measurement station MEA—between which the tables can be exchanged. While one substrate on one substrate table is being exposed at the exposure station, another substrate can be loaded onto the other substrate table at the measurement station or a measurement table can be used at the measurement station and various preparatory steps carried out. This enables a substantial increase in the throughput of the apparatus. The preparatory steps may include mapping the surface height contours of the substrate using a level sensor LS, measuring the position of alignment markers on the substrate using an alignment sensor AS, etc. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These may be docked together when performing preparatory measurements, and then undocked while the substrate table undergoes exposure.

Figure 2:
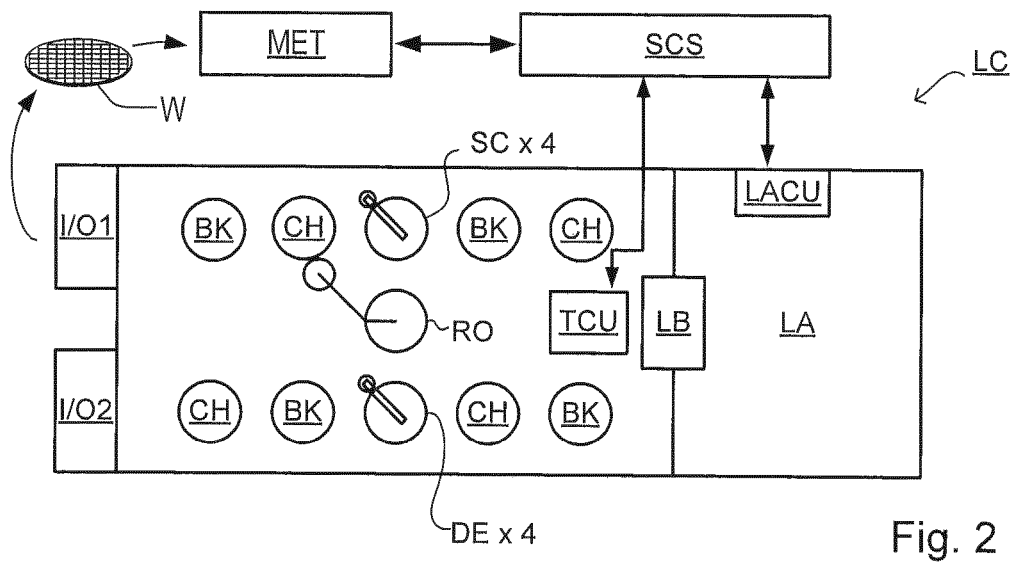
FIG. 2 depicts a lithographic cell or cluster in which an inspection apparatus according to an embodiment may be used.

As shown in FIG. 2, the lithographic apparatus LA forms part of a lithographic cell LC, also sometimes referred to a lithocell or cluster, which also includes apparatuses to perform pre- and post-exposure processes on a substrate. Conventionally these include one or more spin coaters SC to deposit resist layers, one or more developers DE to develop exposed resist, one or more chill plates CH and/or one or more bake plates BK. A substrate handler, or robot, RO picks up a substrate from input/output ports I/O1, I/O2, move it between the different process apparatuses and delivers it to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure one or more properties, such as overlay error between subsequent layers, line thickness, critical dimension (CD), etc. Accordingly a manufacturing facility in which a lithocell LC is located also includes a metrology system MET which receives one, some or all of the substrates W that have been processed in the lithocell. Metrology results are provided directly or indirectly to the supervisory control system SCS. If an error is detected, an adjustment may be made to exposures of one or more subsequent substrates, especially if the inspection can be done soon and fast enough that one or more other substrates of the same batch are still to be exposed. Also, one or more already exposed substrates may be stripped and reworked to improve yield, or discarded, thereby avoiding performing further processing on a substrate known to be faulty. In a case where only one or some target portions of a substrate are faulty, further exposures can be performed only on those target portions which are good.

Within metrology system MET, an inspection apparatus is used to determine the one or more properties of the substrates, and in particular, how the one or more properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure one or more properties in the exposed resist layer immediately after the exposure. However, the latent image in the resist has a low contrast—there is only a small difference in refractive index between the part of the resist which has been exposed to radiation and the part which has not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed part of the resist has been removed—or after a pattern transfer step such as etching. The latter possibility limits the possibilities for rework of a faulty substrate but may still provide useful information.

FIG. 3 depicts an example spectroscopic scatterometer which may be used as an inspection apparatus in a metrology system of the type described above. It comprises a broadband (white light) radiation projector 2 which projects radiation onto a substrate W. The reflected radiation is passed to a spectrometer 4, which measures a spectrum 6 (intensity as a function of wavelength) of the specular reflected radiation. From this data, the structure or profile 8 giving rise to the detected spectrum may be reconstructed by calculation within processing unit PU. The reconstruction can be performed for example by Rigorous Coupled Wave Analysis and non-linear regression, or comparison with a library of pre-measured spectra or pre-computed simulated spectra. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Computer modelling techniques may be used to predict, correct, optimize and/or verify performance of a system. Such techniques may monitor one or more parameter values and predict, correct, optimize and/or verify system performance based on these parameter values. The computer model may be constructed using historical parameter values, and may be constantly updated, improved or monitored by comparing predictions of parameter values to the actual values for the same parameters. In particular, such computer modelling techniques may be used to predict, correct, optimize and/or verify system performance of a lithography system or process.

Context Determination

A significant factor in data mining and predictive modelling is context analysis. The context information can be used as an additional input in either data mining or multivariate based models.

When modelling a lithographic apparatus, inherent defects in the context information may result in erroneous model input data, which in turn may result in erroneous model output (for example, false positives). A significant number of false positives occur as a result of issues with context determination.

In a lithographic apparatus, the context or state, refers to the mode or operational state that the apparatus is in when a parameter value is recorded. Less formally, it is a measure of what the machine is doing when the parameter value is recorded. Different contexts may include, for example: "up", "production", "idle", "scheduled down", or "unscheduled down".

Normally, it is possible to determine the context from parameter values of the one or more parameters being monitored. To do this, the predictive model may comprise or use a context engine to determine parameter data context from the parameter data. However, at certain times, determination of context from the parameter data becomes more difficult. In particular, this may be the case during a context transition; that is when the lithographic apparatus transitions from one operational state to another operational state. However, this will not necessarily be the case for all transitions. Should the context engine make an error in determining the context, the model output accuracy may be compromised.

Normally, the context engine assumes that each transition between contexts is instantaneous. However, the reality is that each transition takes a finite time, and during the transition, context determination may be less accurate.

It is therefore proposed to use a priori knowledge of context determination accuracy for all contexts to determine a quality weighting for the context determination. This quality weighting may be determined per segment of a context. Each context may be segmented into context segments. This segmentation may segment each context into transitional segments and intermediate segments. More specifically, the transitional segments may comprise a beginning segment and an end segment. In an embodiment, the transitional segments may be relatively short compared to the intermediate segment. It may also be that one or more contexts are segmented into fewer or more than three segments, as is appropriate.

A priori analysis may be used to determine a measure of the accuracy of a context determination for each context segment; that is for every segment of every context. This may comprise a measure of the probability that a context determination for each context segment will be correct. The quality weighting may be derived from this accuracy measure.

It may be that the quality weighting will be lower for transitional segments relative to intermediate segments. However, this will not necessarily be the case, and the quality weighting assigned to a particular segment will depend on the a priori analysis and therefore the actual context and segment of that context.

In an embodiment, a database or file of quality weightings will be determined, one weighting for each of the possible context segments a system (e.g., lithographic apparatus) may be in. For example, the beginning, intermediate and end segments of an "idle state" context may each be assigned a quality weighting. Similarly, each segment of a "production state" context may each be assigned a quality weighting. This can be done for each context.

It should be appreciated that the accuracy measure, and therefore quality weighting, may also depend on the actual context transition. The context transition describes which context the system is transitioning from and which context it is transitioning to. Specifically, the accuracy measure may be dependent, not only on which context segment the system is operating in, but also the preceding and/or succeeding context segment. By way of specific example, the quality measure applicable for the end segment of "production state" context may be dependent on the succeeding context, for example, the quality measure may be different if this succeeding context is "scheduled down" or "unscheduled down". As a consequence, in an embodiment, quality weighting may be determined for each context segment, per context transition. This means that quality weighting may be determined for each context segment in dependence of the context segment immediately preceding it or the context segment immediately succeeding it. Therefore, by way of specific example, a different quality weight may be determined for the end segment of "idle state" context, for each possible succeeding state. Similarly, a different quality weight may be determined for the beginning segment of "idle state" context, for each possible preceding state.

Once this database has been determined, it can be used to assign quality weighting to parameter output depending on the context determination. The quality weighting can then be used as a model input. In an embodiment, this quality weighting may be binary (1 or 0), such that parameter data corresponding to segments with an acceptable quality weighting (e.g., a quality weighting above a threshold) are given normal consideration and parameter data corresponding to segments with an unacceptable quality weighting (e.g., a quality weighting below a threshold) are ignored. In such an embodiment, it may be that intermediate segments are always weighted "1". However, other weighting schemes are possible; such weighting schemes may have different resolution (not necessarily binary). For example, the weighting may be such that some parameter data may be given a level of consideration which varies depending upon the quality weighting assigned to the segment corresponding to the parameter data.

Figure 4:
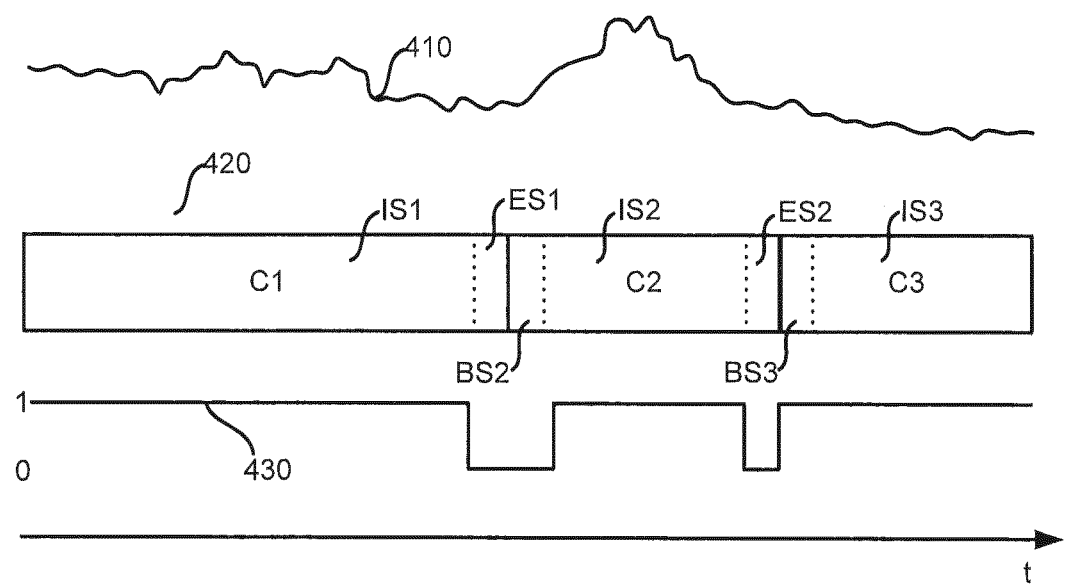
FIG. 4 is a timing diagram illustrating a method of assigning quality weights to parameter output depending on context determination.

FIG. 4 is an example timing diagram illustrating the above concept. Shown are a time axis t, and a trace for a parameter output 410. Below this is the lithographic apparatus context engine output 420 illustrating the context assigned to the parameter data. In this example, a first portion of the output is assigned context C1, a second portion of the output is assigned context C2, and a third portion of the output is assigned context C3. Each of these contexts has been segmented into segments. Only a latter part of first context C1 and an initial part of context C3 is shown. Consequently, the timeframe illustrated shows the intermediate segment IS1 and end segment ES1 of context C1, the beginning segment BS2, intermediate segment IS2 and end segment ES2 of context C2, and the beginning segment BS3 and intermediate segment IS3 of context C3. Trace 430 shows the output of the quality weighting. As can be seen this output is at "1" for segment IS1, but falls to "0" during the transition segments ES1 and BS2. This may be because it has been determined beforehand that the parameter output data 410 during end segments of context C1 and beginning segments of context C2 are not reliable. The fact that the context transition is from context C1 to context C2 may or may not be taken into account. The quality weighting output 430 is again "1" during intermediate segment IS2, and falls again to "0" for transition segment ES2. It can be seen, however, that the quality weighting output 430 is "1" during transition segment BS3 indicating that it has been evaluated that parameter data during the beginning segment of context C3 is of acceptable quality. The quality weighting output 430 remains at "1" during segment IS3.

Figure 5:
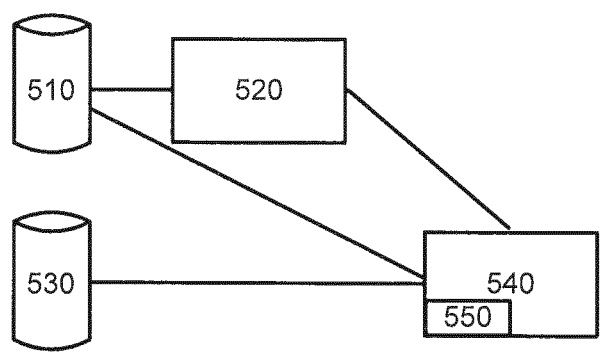
FIG. 5 is a system diagram illustrating a system operable to assign quality weighting to parameter data, according to an exemplary embodiment.

FIG. 5 is a system diagram illustrating a system operable to assign quality weighting to parameter data, according to an exemplary embodiment. Context data 510 is used to derive a quality weight ruleset 520. The quality weight ruleset 520, context data 510 and model input data (e.g., parameter data from sensor output) 530 are used as inputs to a predictive model 540, which comprises a context engine 550. The predictive model will use the quality weight ruleset 520 to assign quality weighting to the model input data 530 depending on the output of the context engine 550.

Automated Maintenance Action Detection

Where an apparatus, such as a lithographic apparatus has its operation monitored using a large number of models, many calculations may require reinitializing following a maintenance action. A maintenance action may be indicated as having been performed manually, or via an automated input of service logging. Manual indication has a disadvantage of being labor intensive due to the large number of subsystems and models, and the large number of parameters. Any delays or errors in the inputs will result in deteriorated model performance. Present automated indication solutions are subject to accuracy issues and deviations of up to 4 days have been noticed in the actual maintenance action and the service loggings. Due to the sensitive nature of lithographic systems, such deviations also result in deteriorated model performance.

Therefore a method for automated maintenance action detection for predictive maintenance purposes is proposed. The proposed method uses two observations: 1) that a maintenance action in general increases the process capability of a process and 2) a maintenance action is reflected in the data as a step; i.e., a sudden and persistent change in the central tendency in the data.

Process capability is a measure of the ability of a process to produce output within at least one process limit, specification or other requirement. All processes have inherent statistical variability which can be evaluated by statistical methods. By evaluating this statistical variability, a measure of the probability that a measureable characteristic of the process is (or is not) within a predefined specification can be determined. To measure process capability, a measure of the variability of the output of a process is obtained, following which this variability measure is compared to a proposed specification or product tolerance (for example one or more process limits).

Process capability may be expressed in terms of a process capability index (e.g., $C_{pk}$ or $C_{pm}$) or as a process performance index (e.g., $P_{pk}$ or $P_{pm}$). Any measure of process capability can be applied within the teaching of this embodiment. Process capability indices measure how much natural variation a process experiences relative to its specification limits. The concepts of process capability generally, and process capability indices, are known and will not be described in further detail here.

Figure 6:
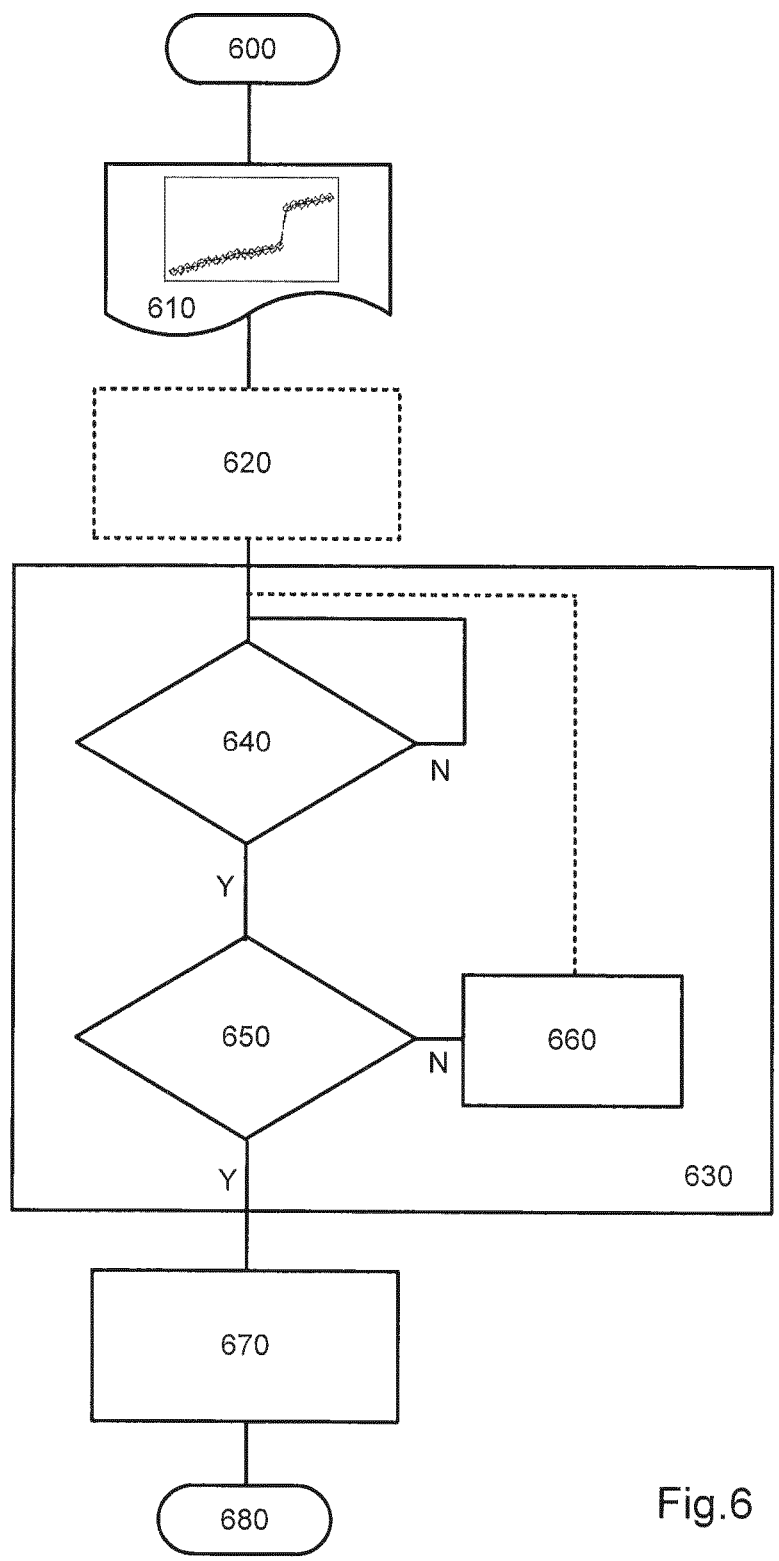
FIG. 6 is a flow diagram illustrating a method for automated maintenance action detection according to an exemplary embodiment.

FIG. 6 is an example flow diagram illustrating a method for automated maintenance action detection. The steps are as follows, and are then described in greater detail thereafter (the order of some steps may be switched):

600—Start;
610—Process data;
620—Context filtering;
630—Automated maintenance detection algorithm;
640—Step detected?
650—Process capability improved?
660—"Step" alert;
670—Use algorithm output;
680—End.

Block 610 represents process data, which may comprise one or more machine (or other process) parameters. The machine may comprise a lithographic apparatus such as described herein. By way of example, the one or more process parameters may be obtained from one or more machine sensor outputs. Alternatively or additionally, the one or more process parameters may be obtained from measurement performed on one or more products produced by the machine. The process data may be raw or it may be transformed, filtered or conditioned in some way.

Step 620 is an optional initial step of context filtering. The context filtering may comprise applying quality weighting to the process data and using the process data in accordance with this quality weighting. The context filtering may be as described above, in relation to FIG. 4 and FIG. 5.

Many parameters only vary in a single direction, that is they only increase (or only decrease) in value during the process. As such, a single sided measure of process capability may be appropriate. In an embodiment, the measure of process capability used in this step is $C_{pk}$, and more specifically a one sided $C_{pk}$. However, other measures of process capability may be used.

Block 630 represents the automated maintenance detection algorithm which performs steps 640 to 660.

At step 640, it is determined whether there is a step in the process data. The step should be a clear and persistent step in the process data values. In other words, the process data values should be seen to show a jump (or fall) which occurs over a short timeframe relative to the general process data trend before the step. This step should be persistent, that is the values should remain at or around the new level after the step, and/or show a similar trend either side of the step. A spike (or dip), e.g., a jump shortly after which the values return to a similar level is not considered a step in this context. If no step is detected, the algorithm 630 returns to the beginning of step 640 so as to continue monitoring for a step in the incoming process data. Techniques for determining the time of a particular event (such as a step) in parameter data is disclosed below and can optionally be used in this step.

At step 650, if a step in the process data has been detected at step 640, it is determined whether the process capability of the process has improved as a result of this step in the process data. This step may comprise obtaining a measure of the process capability before the step and after the step. If the measure of the process capability after the step shows improvement relative to that before the step then it is determined that a maintenance action has occurred and the algorithm continues to step 670. If the process capability shows no improvement then (optionally) at step 660 a step alert is generated. This is to alert a user of the machine that there has been a step in the process data which is not the result of a maintenance action. This may be indicative of an issue which needs attention. The algorithm may then continue monitoring of the incoming process data at step 640, or else stop. As stated above, this step may use a one-sided $C_{pk}$ as a measure of the process capability, or any other suitable measure.

At step 670, the detection of the maintenance action is used in some manner. This step may comprise resetting the related model algorithms, prompting engineers or any other action.

Methods of Managing Alerts

At present, significant effort is expended on the creation of predictive models, and more specifically predictive models which predict failures. Methodologies, which may, e.g., include statistical process control approaches and data mining approaches, can be employed to create a predictive model which can predict machine failure and generate alerts before failure occurs. Consequently, the majority of effort to date has been spent on the modelling and generation of alerts. How alerts are handled after generation has not been given the same focus.

Once alerts are generated, it is assumed that they will all be promptly acted upon, and that engineers define and plan actions for all alerts. While this would be an ideal situation, the reality is that engineer time and resource is finite, and the modelling of complex machines such as lithographic apparatuses may generate too great a number of alerts for them to be all attended to promptly. As a result, it may be the case that engineers make a selection of the alerts to follow up on (in accordance, for example, with their expertise as to which alerts are the most important and/or time critical). This will result in the alerts which have not been selected for attention, to be left unattended but still active.

It may be that, presently, no consideration is given to the stoppage of an unattended alert. This can lead to an unmanageably long list of active alerts for which attention is sought. Additionally, for non-perfect models, the benefit (which may, for example, be dependent upon business information) of attending to older alerts may become negative. In fact, it can be shown that this is the case for all alerts. In other words, the benefit in attending to the alert from a business perspective may be outweighed by the cost in one or more of engineer time and resource, tool time and resource, and/or tool downtime. A reason for this is that the probability that a failure will occur imminently after an alert is raised falls over the time during which the alert is unattended. In other words, the longer an alert has been active without a corresponding failure actually occurring, the less likely it is that that failure will actually occur in the immediate future. Taking a cumulative probability curve for example data, it can be shown that the probability of a failure within 20 days of an alert is approximately 75%. This rises to about 85% after 50 days and to about 90% after 100 days. This shows that, if no failure has occurred by 20 days, the chances of failure within the next 100 days or so is quite small; few of the machines which have not failed by 20 days then go on to fail in the next 100 days.

It is therefore proposed to determine a benefit metric describing the benefit of attending to an alert as a function of time. Such a benefit metric may take the form of underlying probability distributions for predicted failures. Based on the benefit metric and a cost metric obtained from known business information, it is possible to evaluate the expected benefit against cost in attending to each alert as a function of time. From these determinations, a management action may be performed, for example an alert expiry time can be calculated for some or all of the alerts. This alert expiry time can be automatically applied to the alerts, or otherwise monitored, and unattended alerts can be cancelled/reset once the alert expiry time is reached. In this way, unattended alerts will expire when the business impact (or other criteria) becomes too low for it to be worth attending to them. Of course, not all alerts need be assigned an alert expiry time; some alerts may be determined as critical and should remain active until attended to (or, to the same effect, may be assigned an alert expiry time of infinity).

The underlying probability distributions can be obtained using backend test results from testing of the predictive model. Backend testing is a significant part of model building and maintenance. Backend testing comprises applying the model on historic data for which outcomes are known, and comparing the known outcomes to the model's predictions for those outcomes. In this way the accuracy of the model's predictions can be verified. Also, the model parameters may be altered to reduce or minimize the difference between the modelled outcomes and actual outcomes when the model is run again. An output of backend testing may be a confusion matrix (or error matrix) and related model characteristics (for example: precision and/or sensitivity).

In a specific example, the underlying failure probabilities may be approximated by way of a Weibull approximation. The Weibull approximation may construct the underlying failure probability as function of the days since the alert. When a model is backend tested, a cumulative distribution function may be used. The cumulative distribution function can be interpreted as the fraction of failures after time x since the alert. From this, one backend test result which can be used in this method is the remaining useful life (RUL), defined as being the time at which 80% of items/systems corresponding to the alert have failed after generation of the alert.

The alert expiry time $t_{stop}$ may be defined as the time after which, on average, the benefits do not outweigh the cost anymore, and under the condition of a Weibull distribution may be given by:

$$t_{stop} = RUL * \ln(5)^{-\frac{1}{\beta}} * \left( \ln\left( \frac{B}{C} * \frac{\text{precision}}{1 - \text{precision}} \right) \right)^{\frac{1}{\beta}} \quad \text{Equation (1)}$$

where β is the so-called shape factor of the Weibull approximation appropriate for the model, B is a benefit metric of a proactive action, C is a cost metric of an alert validation, Precision is the standard deviation of the estimator, and RUL is the time after which 80% of the failures have occurred in a cumulative failure probability distribution function.

Figure 7:
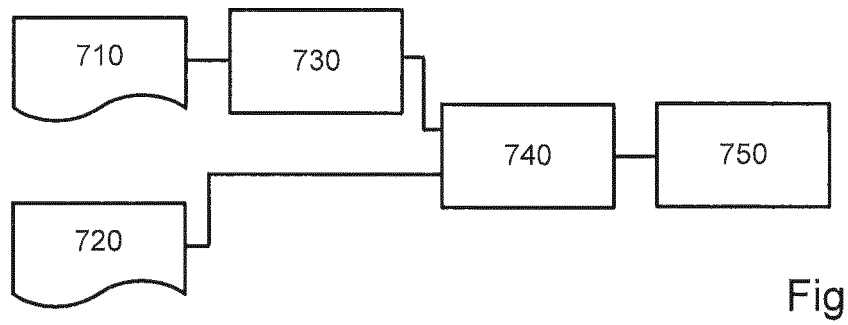
FIG. 7 is a flow diagram illustrating a method to assign alert expiry times, according to an exemplary embodiment.

FIG. 7 is a flow diagram illustrating a method to assign alert expiry times, according to an exemplary embodiment. The steps are as follows, and are then described in greater detail thereafter (the order of some steps may be switched):

710—Backend test results;
720—Business information;
730—Determine probability distributions;
740—Determine alert expiry time;
750—Monitor expiry times.

Backend test results 710 are used to determine a benefit metric for each possible alert. Such a benefit metric may comprise or be derived from a failure (or other event) probability distribution over time following an alert. The probability distributions describe the probability of a failure occurring after an alert as a function of time. Such a probability distribution may comprise a cumulative or non-cumulative probability that a failure will occur over the time since alert. For example, such a probability may be approximated using a Weibull approximation. In an embodiment, the benefit metric is a measure of the downtime reduction potential for certain failure scenarios derived from the failure probability distribution.

The benefit metric determined in step 730 and a cost metric obtained from business information 720 are used to determine an alert expiry time for each alert at step 740. The alert expiry time may be calculated using Equation (1). The business information 720 may include the costs of certain alert attendance scenarios (e.g. maintenance and/or repair actions appropriate for a particular alert). Such a cost metric may take into account any cost or overhead in attending to an alert, and may include, for example, machine downtime, reduced productivity, financial cost and/or resource utilization (person and/or machine). The alert expiry time can be obtained from an evaluation of the benefit against cost in attending to an alert as a function of time. The alert expiry time can be determined based on whether the evaluation of benefit against cost meets or passes a threshold. The threshold may be defined as the point at which it is determined that the benefit against cost is negative, and therefore the costs outweigh the benefit.

A step 750, the alert information is displayed. When an alert expiry time is reached for an alert, the representation of that alert may be changed in some way. It may be that an alert is automatically reset at the alert expiry time, or else the alert may be displayed as being expired. This displaying of the alerts may be performed as part of a front end process, while the other steps of the method may be performed as a back end process which may or may not be part of the front end.

As previously described, there are too many alerts generated than can be attended to promptly. From a business perspective, alerts generated have a varying impact. This impact depends on the time for which an alert remains unattended since the alert was generated. This implies that the priority of the alert will be time variable. Determination of priority at present is a human (user) decision process. However, the priority of a pending alert, relative to the other pending alerts, can change quickly and may therefore be onerous to maintain accurately.

In another embodiment, the business information and associated cost metric, and the benefit metric obtained from or comprising the probability distributions (obtained in turn from backend test results) for each predictive model can be used to determine a priority metric for each alert. The priority metric will be time dependent and therefore relative rankings of unattended alerts may vary over time. The method may comprise determining a priority metric for each alert which is a measure of the instantaneous impact of the alerts. A reference model and corresponding reference priority metric is then identified; this may be the model having the highest priority metric (and therefore highest instantaneous impact value for an intervention) at the time the impact is generated. The priority metric may be defined on a logarithmic scale, such that alerts may be ranked, for example, from 1 to 5 or 1 to 10, with each ranking representing an order of magnitude greater intervention benefit impact than a previous ranking, relative to the reference priority metric. The alerts can then be given a priority ranking based on the priority metric values at a given time.

Figure 8:
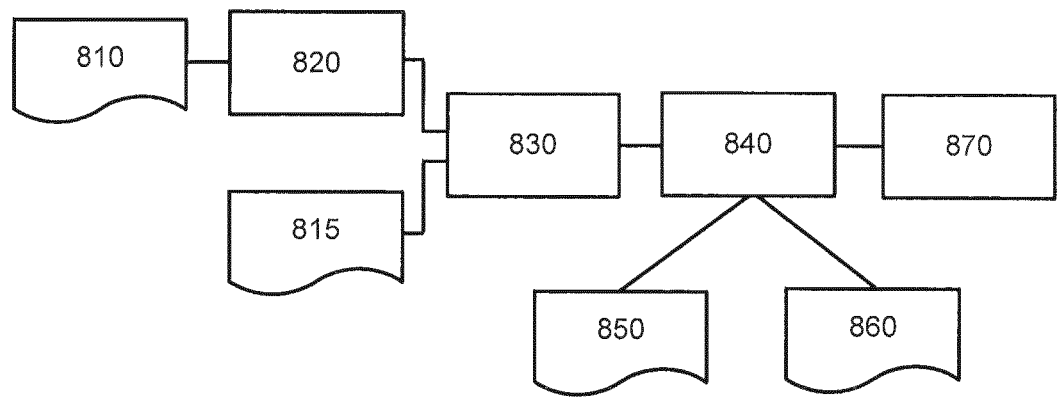
FIG. 8 is a flow diagram illustrating a method to prioritize alerts, according to an exemplary embodiment.

FIG. 8 is a flow diagram illustrating a method to prioritize alerts, according to an exemplary embodiment. The steps are as follows, and are then described in greater detail thereafter (the order of some steps may be switched):

810—Backend test results;
815—Business information;
820—Determine probability distributions;
830—Determine instantaneous impact of intervention (priority metric);
840—Cast relative instantaneous impact on a logarithmic scale;
850—Reference priority metric at t=0;
860—Priority scale and direction, logarithm base;
870—Display priority ranking.

At step 820, as in the previous embodiment, backend test results are used to determine a benefit metric. As before the benefit metric may comprise or be derived from failure (or other event) probability distributions over time following an alert. This is essentially the same step as 730.

At step 830, a priority metric is determined for each alert. The priority metric is a measure of the instantaneous impact of an intervention or follow up action to an alert being generated. The priority metric is determined using the probability distributions from the previous step and business information. As with the previous embodiment, business information may come in the form of, or allow the generation of, a cost metric for any intervention. The business information will also include a measure of the instantaneous impact of an intervention at time t=0, that is at the moment that the alert is generated. Using this information, and the benefit metric (probability distributions), a measure of the instantaneous impact of an intervention at t>0 can be determined.

In an embodiment, the priority metric takes the form of the expected instantaneous impact EII. EII is a measure of the impact of a proactive action, assuming immediate proactive action after time "x", multiplied by the probability of instantaneous failure after time "x". This may specifically take the form:

$$EII = \frac{A}{RUL^\beta} * \frac{\text{precision}*\left(e^{-\left(\frac{t}{\tau}\right)^\beta}*B + C\right) - C}{1 + \text{precision}*\left(e^{-\left(\frac{t}{\tau}\right)^\beta} - 1\right)} \quad \text{Equation (2)}$$

where t is time since alert in days and A is a constant.

At step 840, the priority metrics are cast on a logarithmic scale relative to a reference priority metric. The reference priority metric may be the priority metric determined to have the greatest instantaneous impact value (priority=1) at time t=0 in step 850. This can be derived from the business information. The priority metrics of the other alerts are then compared to the reference priority metric for the present time or other time t>0. By taking the logarithm (of any base) of the priority metrics, a priority ranking can be calculated for the alerts.

This may be achieved by mapping the expected instantaneous impact EII on a linear scale from 0 to N, with N being the lowest impact and 1 the highest (and 0 being extraordinarily high). When taking the logarithm of the priority metrics, the following three conditions should be met:

The lower the priority metric, the higher the actual priority;

When the EII is zero, the priority is N+1 (lower than the lowest priority);

The priority of the reference priority metric is set to 1.

This results in the following exemplary formula for calculating a priority ranking Priority (t):

$$\text{Priority}(t) = \left\lceil N + 1 - \frac{\ln EII}{PS} \right\rceil \quad \text{Equation (3)}$$

where the brackets indicate that the result is rounded up and PS is the reference priority metric having priority 1 at t=0, defined as:

$$PS = \frac{\ln\left(\frac{1}{RUL^\beta} * (\text{precision} * (B+C) - C) + 1\right)}{N}$$

At step 870, the (unattended) alerts are displayed according to their priority ranking for the appropriate time (which may be the instant time). The priority metrics and the priority ranking may be recalculated at regular intervals, for example on a daily basis, half-daily basis or (multi or singular) hourly basis. Changes in relative priority metrics for each unattended alert will result in a specified change in the alert representation. The displaying of the priority rankings may be performed as part of a front end process, while the other steps of the method may be performed as a back end process which may or may not be part of the front end.

In a specific example where N=10, priority rankings of 0, 1 or 2 indicate a very high priority and the corresponding alerts may be represented as such (e.g., by being colored red). Similarly, alerts corresponding to a priority ranking between 3-7 may be represented as medium urgency (e.g., colored orange or yellow) and alerts having a priority ranking 8, 9 or 10 may be represented as low urgency (e.g., colored yellow or green). If the priority ranking is greater than 11, the alert may simply be expired.

The methods for prioritizing alerts and for determining alert expiry times can be combined, such that each alert is provided with both a priority ranking and an alert expiry time. Note however, that alerts having a priority of N+1 or greater can simply be removed and no alert expiry time need be generated.

Identifying Causal Relationships Using Transfer Entropy in Lithographic Systems

A lithographic apparatus can be thought of as a complex distributed processing system comprising many subsystems. The lithographic apparatus typically generates an event log, among other data sources. This event log is generated by each subsystem of the lithographic system, and is a record of lithographic apparatus events. Exception linking, which is the mechanism which links recorded events, does not enable causal relationship (cause and effect) to be traced; it simply clusters recorded events that essentially describe the same observable root exception (root cause). The event log does not indicate repair strategies nor does it indicate solutions and/or design improvements. Event log data also lacks synchronization; the clocks of different subsystems are not necessarily synchronized. As a result, exception linking is not normally more than 50% accurate in detecting root exceptions.

Diagnostic time may be effectively reduced or minimized through reutilizing solutions which have solved previous failures. However, to efficiently solve unprecedented failures or learn from past events to improve future designs, the event log lacks an embedded causal structure to reliably identify fault-to-failure paths. Information describing fault evolution and propagation paths is also significant for the development of lithographic apparatus prognostic models, which are now primarily based on expert knowledge that only relates known causal relationships between predictive observables (notably performance parameters). This leaves an unknown collection of potentially predictive, and possibly coupled, observables unexplored.

A lithographic apparatus can be described in terms of a network of driving and responding observables (i.e., cause and effect relationships). It is proposed that the concept of transfer entropy be used to determine causal relationships between pairs of these observables. This enables a causal mapping of the network to be performed, from which fault to failure paths and root exceptions can be determined.

Transfer entropy enables the inference of a causal network of observables, through computation of information transfer in bits, between any pair of simultaneously observed, possibly coupled, time series. The time series may come from, for example, event log data, performance parameters, board dumps, test data, metrology data or trace data. The resulting transfer entropy is able to distinguish driving and responding observables and detect time-asymmetry in their interactions. Being a non-parametric measure, capable of identifying arbitrary linear and non-linear causal effects without the need of a model, transfer entropy can effectively gain a better understanding of the underlying dynamics of the lithographic apparatus. This will aid accurate failure diagnosis and prognosis, as well as structural design improvements. This can be achieved through:

reconstruction of lithographic apparatus causal connectivity from observed time series;

analysis of fault evolution and propagation paths;

analysis of performance degradation;

analysis of lithographic apparatus control performance;

observability analysis of lithographic apparatus observables from measured time series.

Transfer entropy is a directional measure of asymmetrical information flow and is described in "Measuring Information Transfer" by Schreiber T. (*Physical Review Letters* 85 (2): 461-464), which is herein incorporated by reference in its entirety. Transfer entropy is a measure of the entropy difference between a future observation based solely on previous values for that observation (its own past), and a corresponding future observation based on previous values for that observation and previous values for another observation (its own past and the past of another observation). In other words, transfer entropy from a process X to another process Y is the amount of uncertainty reduced in future values of Y by knowing the past values of X given past values of Y.

In information theory, entropy (more specifically, Shannon entropy) is a measure of the expected value (average) of the information contained in each message (e.g. an event or value within a time series or other data stream) received. More specifically, Shannon entropy $H(Y_t)$ describes the average number of bits needed to optimally encode independent draws of the discrete variable $Y_t$ following a probability distribution p(y):

$$H(Y_t) = -\Sigma_{y \in Y} p(y) \log p(y) \quad \text{Equation (4)}$$

Transfer entropy T can be described as:

$$T(X_t > Y_{t,\tau,k,l,\omega}) = \sum_{y_t, y_{t-\omega\Delta t}^{[k]}, x_t^{[l]}} p(y_t, y_{t-\omega\Delta t}^{[k]}, x_{t-\tau\Delta t}^{[l]}) \log \frac{p(y_t \mid (y_{t-\omega\Delta t}^{[k]}, x_{t-\tau\Delta t}^{[l]}))}{p(y_t \mid y_{t-\omega\Delta t}^{[k]})} \quad \text{Equation (5)}$$

where p(a,b) is the joint probability of events a and b occurring at the same time, and p(b|a) is the conditional probability which equals $p(a,b)/p(a) \cdot y_t^{[k]}$ and $x_t^{[l]}$ are the immediate history of time series $X_t$ and $Y_t$ of time interval k and l respectively. In the above the lag parameter $\omega$ accounts for the situation that the k length history of $Y_t$ that provides the most information about $Y_t$ may not be its immediate history at $\omega=1$ but is located $\omega > 1$ time steps earlier (time steps are in units of $\Delta t$ or dt). Similarly the time lag $\tau$, allows consideration of l length history of $X_t$ at a distance t that provides additional information over and above what is contained in $Y_t$'s own history. T measures the reduction in the uncertainty of the current state of $Y_t$ which is gained from the l length history of $X_t$ that is not present in the k length history of $Y_t$ itself.

Assuming $l=k=\omega=1$, and time lag $\tau$ is an unknown to be determined, then the equation for transfer entropy T can be simplified to:

$$T(X_t > Y_t, \tau) = \sum_{y_t, y_{t-1}, x_{t-\tau}} p(y_t, y_{t-1}, x_{t-\tau}) \log \frac{p(y_t \mid (y_{t-1}, x_{t-\tau}))}{p(y_t \mid y_{t-1})} \quad \text{Equation (6)}$$

In this recital, transfer entropy T is a measure of the information contributed to $y_t$ by $x_t$ across time lag $\tau$ additional to that contributed by $y_{t-1}$. By computing T across many time lags, it is possible to assess the time scale of directional coupling from $X_t$ to $Y_t$. Equation (7) can be written in an alternative form, in terms of component Shannon entropies H:

$$T(X_t > Y_t, \tau) = H(X_{t-\tau}, Y_{t-1}) + H(Y_t, Y_{t-1}) - H(Y_{t-1}) - H(X_{t-\tau}, Y_t, Y_{t-1}) \quad \text{Equation (7)}$$

where (for example) H(X,Y) is the joint entropy between two parameters X and Y. It should be noted that other measures of entropy, in the information theory sense, can be used in determination of transfer entropy. The use of Shannon entropy is only an example.

To apply transfer entropy to lithographic apparatus events, such as those recorded the event log, the following decisions are made:

1. What constitutes an 'event'. This can be anything, for example, which is recorded in the event log, and/or may comprise: parameter values from sensors, measurements performed by the lithographic apparatus, and/or measurements performed on lithographic apparatus produce. Such events should be recorded continuously or periodically so that a time series of events can be constructed for each parameter.
2. How to discretize the observed time series from systems having continuous state spaces or, in order to reduce the number of possible states, further discretize natively discrete time series from systems having high-dimensional state spaces. Since the transfer entropy measure in Equation (6) is derived for discrete time series, discretization of observed time series may be a necessary step towards estimation of transfer entropy. Discretization can, for example, be performed by sorting the set of values of a time series from smallest to largest and equally partitioning the sorted set into a number of bins, each assigned a state. The estimation of transition probability is then straightforward to calculate from occurrence frequency.
3. What block length of past values should be applied for the source and target parameter.

Figure 9:
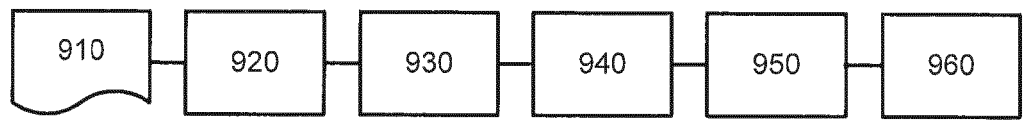
FIG. 9 is a flow diagram illustrating a method to construct a network of causal relations, according to an exemplary embodiment.

FIG. 9 is a flow diagram illustrating a method to construct a network of causal relations, according to an exemplary embodiment. The steps are as follows, and are then described in greater detail thereafter (the order of some steps may be switched):

910—Set of time series;
920—Quantify causal relations between all pairs of subsystem parameters by measuring transfer entropy between their time series data;
930—Test the statistical significance of the calculated transfer entropy values, using surrogate data and bootstrap methods;
940—Compute synchronization ratio Tz;
950—Identify characteristic time lag;
960—Construct the network.

910 is a set of time series comprising a time series for each one of a plurality of parameters.

At 920, a value for transfer entropy T can be calculated for all pairs of subsystem parameters (this should be in both directions, as transfer entropy is asymmetric). This may be performed for multiple time lags using Equation (5), Equation (6) or Equation (7), for example.

At step 930, the statistical significance of each calculated transfer entropy value can be calculated. This is a test of whether a parameter relationship described by a transfer entropy value is stronger than that which would occur through random chance between unrelated time series. This can be done by comparing each transfer entropy value T to a significance threshold $T_s$. The significance threshold $T_s$ may be determined based on a shuffled surrogate transfer entropy. Where T describes the transfer entropy between time series $X_t$ and $Y_t$, the shuffled surrogate transfer entropy will be the transfer entropy of time series $X_s$ and $Y_s$, where time series $X_s$ and $Y_s$ are randomly shuffled (in time) versions of time series $X_t$ and $Y_t$, respectively. This shuffling destroys time correlations between the time series. Only if the transfer entropy value T is greater than the significance threshold $T_s$, is it presumed that there is significant flow of information between the relevant parameters. Transfer entropy values that fall below the significance threshold $T_s$ cannot be considered statistically meaningful for the establishment of a significant coupling.

In an embodiment, shuffled surrogate transfer entropies are calculated for a number of realizations of shuffled time series $X_s$ and $Y_s$, resulting in a Gaussian distribution of surrogate transfer entropies. The significance threshold $T_s$ can then be based on the mean of this Gaussian distribution; for example it can be set at a number of standard deviations above the mean.

At step 940, a synchronization ratio $T_z$ can be calculated, to help determine the reasons behind an observation that two parameters share a significant amount of information at a given time scale. The synchronization ratio $T_z$ may be a ratio of the calculated transfer entropy between the two parameters and a measure of shared information between the two parameters. Specifically, the synchronization ratio $T_z$ may be calculated by:

$$T_z(X_t > Y_t, \tau) = \frac{T(X_t > Y_t, \tau)}{I(X_t, Y_t)} \qquad \text{Equation (8)}$$

where $I(X_t, Y_t)$ is the mutual information between $X_t$ and $Y_t$. Mutual information is a measure of the parameters' mutual dependence; that is it measures how much knowing one of these parameters reduces uncertainty about the other. Mutual information can be defined as:

$$I(X_t, Y_t) = \sum p(x_t, y_t) \log \frac{p(x_t, y_t)}{p(x_t)p(y_t)} \qquad \text{Equation (9)}$$

Synchronization ratio $T_z$ measures the transfer of information from $X_t$ to $Y_t$ as compared with the mutual information at zero lag. This ratio enables characterization of the nature of the coupling between the two parameters. It should be noted that the synchronization ratio $T_z$ is asymmetric, and therefore the coupling characteristics between pairs of parameters might be different in different directions.

Where there is coupling between pairs of parameters (in a particular direction), the coupling can be categorized as synchronization dominated, feedback dominated or forcing dominated. Synchronization dominated coupling can be defined as when $T_z<1$ and $T<T_s$. This coupling indicates significant shared information, but no significant information flow. Feedback dominated flow can be defined as when $T_z<1$ and $T>T_s$. This coupling indicates significant shared information greater than significant information flow. This is an intermediate categorization between synchronization coupling and forcing coupling, where substantial synchronization and forcing both exist. Forcing coupling can be defined when $T_z>1$ and $T>T_s$. This coupling indicates significant information flow greater than significant shared information.

At step 950, the characteristic time lag for each identified coupling (each transfer entropy value) can be calculated. This can be the first statistically significant time lag, or else the time lag for which the transfer entropy T is highest (assuming it is statistically significant).

At step 960, given a number of parameters, it is possible to construct a process network by casting each parameter as a node in the network and computing the transfer entropy between each node Links (in each direction) can be shown between nodes where statistically significant coupling has been shown to exist. The process network can also indicate the coupling strength (value of the transfer entropy) and the coupling characterization. A causal matrix may be constructed, where each cell indicates whether there is a directional coupling between two nodes. The causal matrix may be a three dimensional matrix $[n_p \times n_p \times n_t]$, where $n_p$ is the number of parameters and $n_t$ is the number of time lags studied. However, to keep the calculations more manageable, a two dimensional matrix $[n_p \times n_p]$ can be used, comprising values of transfer entropy for each entry which corresponds to the characteristic time lag for that coupling, as determined in the previous step.

The causal matrix may be displayed, for example, as a circular directional chart (nodes and connections), a bubble chart and/or a heat map. In a bubble chart or a heat map, the causal strength (transfer entropy value) may be represented by the bubble diameter or color respectively.

Once the process network is constructed, it may be beneficial to identify the nodes which have more than one in- or out-links. These nodes may have the largest impact on the network. A network centrality analysis may be performed to rank the network nodes in terms of impact. The ranking can then be used to map information flows from fault to failure within the system. By way of example, the rankings can be applied to the entries in the aforementioned event log, enabling indication of the most influential of subsystem reported root errors, in a directed causal graph with normal events, warnings, failure events and alarms.

In summary, as a result of using transfer entropy methods as described to monitor lithographic apparatuses, interactions between lithographic apparatus observables may be viewed as transfers of information. Transfer entropy enables causation analysis on every pair of simultaneously observed lithographic apparatus time series. Transfer entropy enables reconstruction of causal relationships between events, warnings, errors and alarms as opposed to exception-linking between errors and alarms only. From the causal relationships, fault to failure paths can be determined and the root cause of a fault better identified.

Functional Representation in Diagnostics

System diagnostics can present significant difficulties, particularly with new and recently designed systems. Full end-to-end deliverables from, for example, an error alert to a solution for the error may not be available as they may not have been devised. If one item is missing from the end-to-end chain, then diagnostics become difficult or impossible to implement.

For new designs (platforms, systems or products) time is required before diagnostics data and/or experience becomes available, such that diagnostics (e.g., error codes with their possible solutions) can become effective. This can be complicated as content may change through redesigns, increasing this time further. It is therefore proposed that a more functional diagnostic overview be devised, which can be created for each system and subsystem (at multiple levels) during system development. This will provide insight in how the system works and what contributors can fail.

Figure 10:
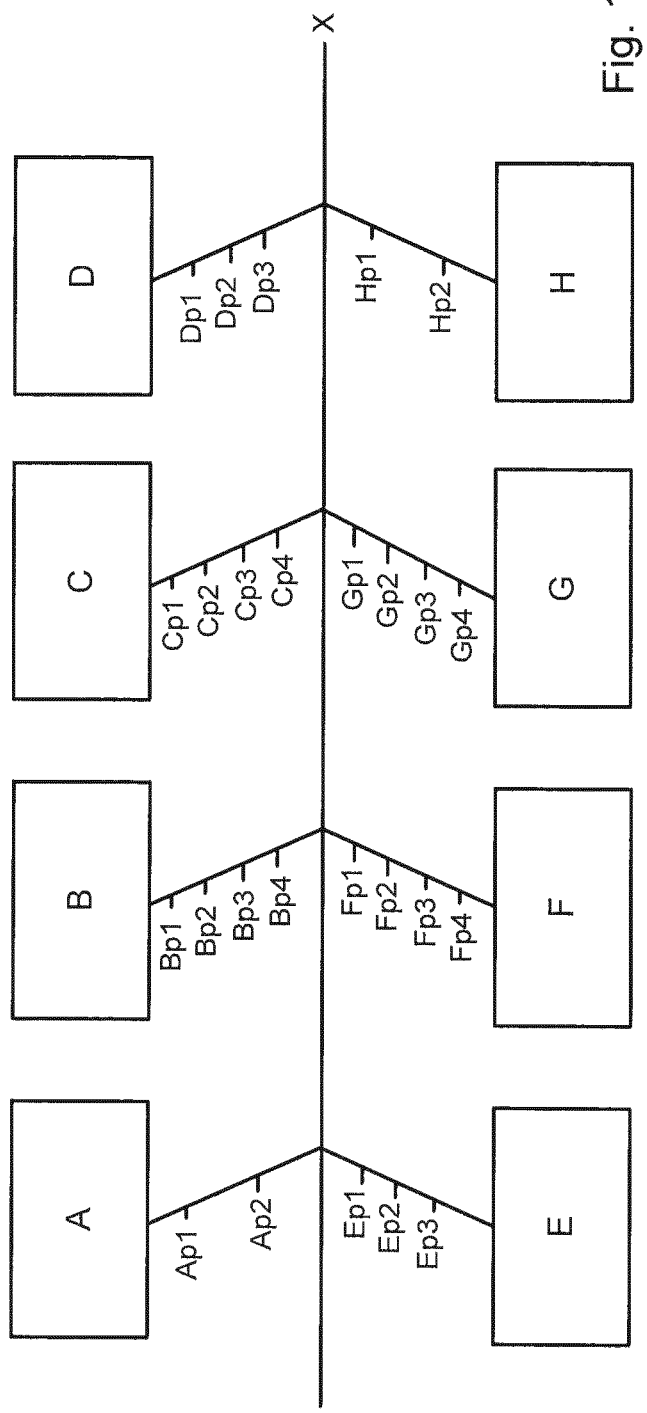
FIG. 10 is a fishbone representation of a system failure.

FIG. 10 shows a method of representing diagnostics commonly referred to as a fishbone diagram. The diagram can be used to represent a list of possible causes of a failure X (showing as a symptom). A-H represent grouping of these possible causes; for example: subsystems Ap1-Hp2 correspond with the causes per group e.g., failing parts and/or settings. In this way, every possible cause which may impact on a failure X can be represented. Each of these can be tested and, for example, checked to see if they are within specification. Purely by way of example, the fishbone diagram may relate to an EUV lithographic system where laser radiation excites a target to generate plasma. In such an example, failure/symptom X may be unstable plasma, one of the observations B may be target shape and its corresponding parameters Bp1-Bp4 may include target size, target orientation, target thickness and target stability. Such fishbone representations are known and will not be described further.

A problem with the fishbone representation of FIG. 10 is that it does not show relationships between subsystems, observations or other elements of system groupings A-H, only the possible contributors Ap1-Hp2 to a specific failure/symptom X. Every time that a system is redesigned, a new fishbone representation will need to be devised for each failure, to show that failure in terms of its possible contributors Ap1-Hp2 (or other contributors as appropriate) within the revised system.

Figure 11:
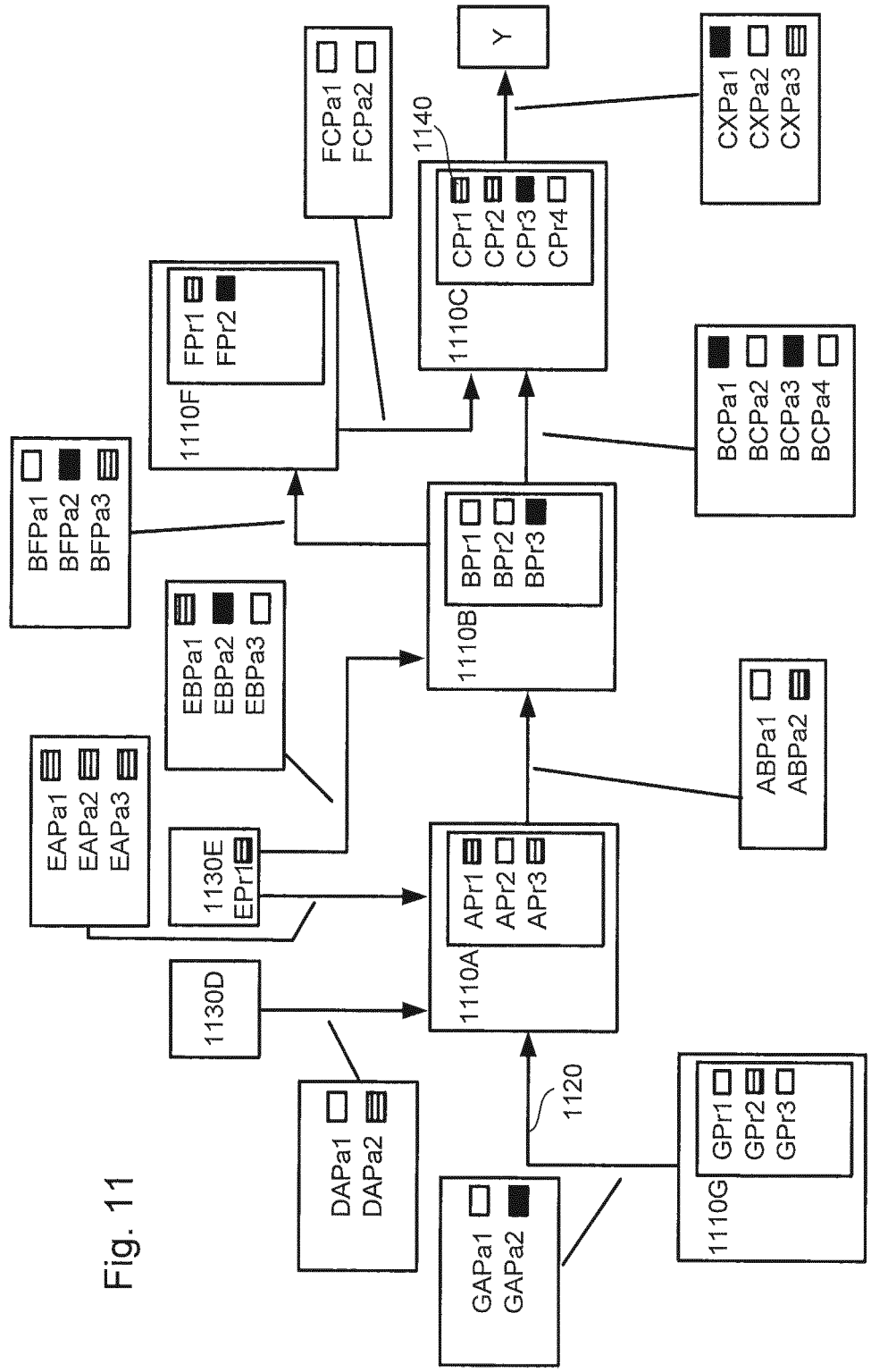
FIG. 11 is a functional representation of a system according to an exemplary embodiment.

FIG. 11 shows a functional representation of a system (or subsystem) according to an embodiment. The system is shown in terms of its elements (e.g., subsystems or components) 1110A, 1110B, 1110C, 1110F and 1110G and how each such element is functionally related to the other elements. The system may provide or result in a function or output Y. Therefore, should there be any failure or fault with function or output Y, this functional representation can be used to perform diagnostics.

The functional representation shows the functional relationships between elements 1110A, 1110B, 1110C, 1110F and 1110G as arrows 112G. For example element 1110F can be seen to depend or else use the output of element 1110B, and in turn, its output is used by element 1110C. Each element 1110A, 1110B, 1110C, 1110F and 1110G may have associated with it one or more properties APr1-APr3, BPr1-BPr3, CPr1-CPr4, FPr1-FPr3 and GPr1-GPr3. Properties APr1-APr3, BPr1-BPr3, CPr1-CPr4, FPr1-FPr3 and GPr1-GPr3 are those which effect operation of the corresponding element, and may comprise properties on which the corresponding element depends, or are required for proper operation of the corresponding element. In the example illustrated, element 1110A relies on three properties to operate properly, APr1, APr2 and APr3. By way of specific example, where the subsystem is a beam delivery system for an EUV lithographic system, the properties may include mirror temperature, mirror orientation and mirror reflectivity/contamination. Elements may include actual physical subsystems (e.g. laser system) or a particular operational step (e.g., "create plasma" or "create Sn target").

Each relationship indicated by arrows 1120 may have one or more associated parameters ABPa1-ABPa2, BCPa1-BCPa4, BFPa1-BFPa3, CXPa1-CXPa3, DAPa1-DAPa2, EAPa1-EAPa3, EBPa1-EBPa3, FCPa1-FCPa2 and GAPa1-GAPa2. For example, the relationship between component 1110G and element 1110A has two parameters associated to it, GAPa1 and GAPa2. These parameters describe the interface between elements, and are the parameters relating to an output of a first element of the relationship, which affects operation of a second element of the relationship. Such parameters may describe what the first element needs to deliver for satisfactory operation of the second element. By way of specific example, where the first element is a laser radiation generator system and the second element is "creation of plasma", then the parameters may comprise laser output power, laser intensity and laser positioning accuracy.

Also shown on the functional representation are facilities 1130D-1130E. These comprise supplies required as an input to particular subsystems for their operation, for example electrical power or cooling fluid. In many cases the property of a subsystem will depend on the status of the facility supplying it. For example, properties BPr1-BPr3 may depend on facility 1130E, otherwise their status may become out of specification.

The functional representation of a system may be multi-levelled such that one or more elements shown in a higher level representation may be described by another functional representation representing an element in terms of its sub-elements, in the same manner as illustrated in FIG. 10. This can be done for any number of levels.

The functional representation may be a passive representation, with the data displayed statically. Alternatively, the functional representation may be active. In such an embodiment, there may be a status indicator 1140 associated with each (or some of) the properties APr1-APr3, BPr1-BPr3, CPr1-CPr4, FPr1-FPr3 and GPr1-GPr3 APr1-FPr2 and parameters ABPa1-ABPa2, BCPa1-BCPa4, BFPa1-BFPa3, CXPa1-CXPa3, DAPa1-DAPa2, EAPa1-EAPa3, EBPa1-EBPa3, FCPa1-FCPa2 and GAPa1-GAPa2. The status indicator may, for example, indicate whether the corresponding property or parameter value is good (e.g., within specification), not good (e.g., out of specification) or unknown. Additionally, the functional representation may indicate whether a property of an element, or a parameter of an interface has gone out of specification by representing the appropriate element or interface arrow differently (e.g. a different color). Other embodiments may display status values.

The status indicators 1140 of the functional representation may be updated in real time. In such an embodiment, the properties or parameters for which the status is known (e.g., good or not good) may be those which are measureable online, while the properties or parameters for which the status is unknown may be those for which an offline measurement is required. Statuses, parameters or values may be displayed as a function of time.

Additional functionality may be provided by having any element, property, parameter or interface for which there is a not good indication to be linked to a solution or guidance on how the problem should be remedied or addressed.

One advantage of the methodology proposed is that relationships between elements with other elements and facilities are shown. This is particularly useful where a potentially important property of an element cannot be measured. If the output of that element falls out of specification as a result of that unobservable property, then it is possible to trace the problem back to a measureable input parameter, or to a measurable property of an element or facility which feeds into the element whose output has fallen out of specification. By way of specific example, say that element 1110A represents a beam delivery system and an output parameter ABPa1 of the beam delivery system shows the beam pointing accuracy to be out of specification. A candidate reason for this is a mirror temperature represented by property APr2. However, its status indicator indicates that the status is unknown and cannot be measured. The representation allows the tracing of the problem back, first to input parameters, e.g., EAPa1 or to a property of a facility or element supplying it e.g., EPr1. For example, where 1130E is a cooling facility, it may be possible that EAPa1 is a measureable parameter for the cooling liquid flow rate, or EPr1 is a measurable property of the cooling liquid temperature.

It is proposed that design documents may be transferred into such a functional representation during the design stage. This can be done without significant additional effort. By using the resultant functional representation, a user can see:
Relationships between different elements.
The critical properties of each element, such as those which are required for each element to perform its function.

The parameters which should be monitored to know whether an element is performing its function.

Which parameter data is generated by the system online and parameter data requires a specific measurement to be made.

Parameter statuses for those which can be measured online.

Which facilities are relevant for each element

Also the facilities that are commonly used, and are therefore critical for the operation of multiple elements.

It should be understood that the particular parameters used in the above examples are not the only ones that may be defined. Additional and/or alternative parameters can be used in a real design process, according to limitations of the lithographic apparatus and the inspection apparatus to be used for the metrology.

Combining Parameter Information from Multiple Machines to Validate Predictive Maintenance System Output In a predictive maintenance system, it is not always clear whether a particular parameter behavior is normal and/or resultant from an external factor or whether the parameter behavior is indicative of an internal issue or failure of a particular machine (e.g., a lithographic apparatus). For example, a parameter may show irregular behavior, and because of this an event indicator or alert may be generated. However, by inspection of parameter data generated by the appropriate sensor(s) of that machine in isolation, it is not possible to determine whether the machine was malfunctioning/out-of-specification in some manner, or whether the machine was actually operating correctly and an external factor (e.g., atmospheric/ambient conditions) was causing the parameter irregularity.

To address this issue it is proposed that parameter data, and in particular equivalent parameter data from multiple machines in the same or similar environment and/or location, be combined. The parameter data may comprise any data measured or derived from one or more sensors which may form part of a machine. By combining equivalent parameter data from multiple similar machines in the same environment (e.g. same room, building or facility), it is possible to determine whether any parameter event, such as a trend or irregularity, is as a consequence of an internal factor or an external factor. This determination can then be used to validate a predictive maintenance system, and in particular, to validate one or more alerts generated by individual machines. This validation can be achieved without adding an additional sensor within the environment to validate sensor output from the machines.

It is common for many similar and/or identical machines to be situated at a single facility, and often within the same room. This may be the case in a semiconductor manufacturing facility comprising multiple lithographic apparatuses. Such lithographic apparatuses may, for example, be all sited within one or more "cleanrooms", which are rooms/areas having a highly controlled environment including a controlled level of contamination particles within the environment.

Where an irregularity is deemed to be as a result of an external factor, it is further possible to utilize a control feedback loop so as to control the external factor (or a cause of it) so as to mitigate or remove the effect of the external factor. For example, where the machines are located in a cleanroom environment, or at least an environment with regulated conditions such as temperature, humidity and/or atmospheric pressure (for example), it is possible to control the environmental system (e.g., HVAC or heating, ventilating and air conditioning system) to mitigate for any measured external irregularity in temperature, humidity and/or atmospheric pressure.

Each of the similar machines within the environment will have at least one, and most likely a number of sensors, each recording parameter data over time (either continuously or sampled at regular intervals). Corresponding parameter data, e.g., data from corresponding sensors of the separate machines can be combined and compared to determine whether any irregularity or alert results from internal or external factors. This determination may be based on whether the irregular behavior can be seen on all of the machines (or at least a number or percentage of the machines above a threshold—e.g., 90%, 95% or 99%). If this is so, it may be assumed that the issue is as a result of an external factor. Conversely, if the irregular behavior is only seen on one or a few machines, it may be assumed that the issue is as consequence of an internal factor of the machine(s) demonstrating the irregular behavior. The actual threshold number or percentage of machines signifying an external factor may be chosen or tuned using a backtesting or validation process. Of course, if one machine shows no irregularity or does not generate an alert when all the other machines do show an irregularity/generates an alert, it may be indicative that the machine not generating an alert is not properly responding to an external factor, and may therefore be operating incorrectly from a machine perspective, even if actually operating within specification. Consequently, any comparison may compare corresponding sensor output of a number of machines, and assume there is an internal issue for a single machine (or a few machines) when the sensor output for that machine deviates from the sensor output from the other machines.

Figure 12:
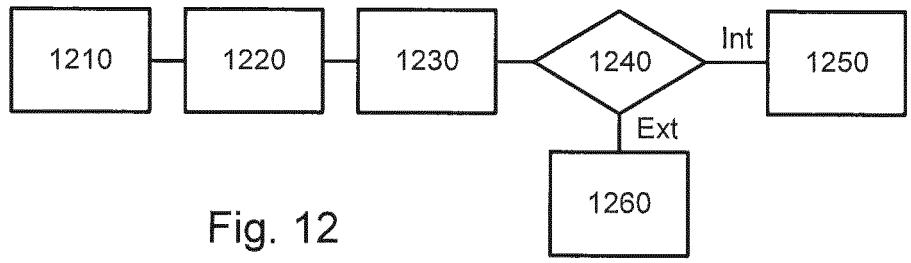
FIG. 12 is a flow diagram illustrating a method of determining whether an event recorded in parameter data is attributable to an external factor according to an exemplary embodiment.

FIG. 12 is a flow diagram illustrating a method of combining parameter data to validate predictive maintenance system output, according to an exemplary embodiment. The steps are as follows, and are then described in greater detail thereafter (the order of some steps may be switched):

1210—Obtain parameter data from corresponding sensors;
1220—Filter, align and interpolate parameter data;
1230—Apply a predictive maintenance algorithm to detect and predict an irregularity/anomaly;
1240—Combine outputs of one or more maintenance algorithms for different machines and determine whether the cause is internal or external;
1250—Perform maintenance action on machine; and
1260—Optionally, if external, calculate and implement correction for environment control.

At step 1210, parameter data from corresponding sensors of multiple similar machines within a single location or site is collected. This may comprise, purely by way of example, data from corresponding temperature, humidity and/or pressure sensors within the machines. Any other parameter data from any other sensor may equally be used.

At step 1220, the parameter data may be transformed, filtered or conditioned in some way (using any standard filtering technique, and/or the context filtering techniques described above). The parameter data may then be temporally aligned, and if necessary interpolated. Techniques for determining the time of a particular event (such as a spike or step) in parameter data that may indicate an irregularity, are disclosed below and can also be used in this step to improve temporal alignment of the parameter data from the different machines.

At step 1230, a predictive maintenance algorithm is applied to each set of parameter data from each machine, to detect a particular irregularity. An alert generation process may be used, such as has already been described elsewhere herein, whereby an event indicator such as an alert is generated for a machine each time an irregularity is detected in the parameter data for that machine.

At step 1240, the outputs of the maintenance algorithm applied to each set of parameter data from each machine is combined to determine whether the cause of the irregularity is internal or external. In an embodiment, this may comprise, where an alert is generated for a particular machine, determining whether a similar alert is generated, or at least a similar parameter data trend can be seen, for the other machines at the same time. If it is determined that all the machines (or possibly most of the machines) generate an alert at the same time, or within the same time frame (coincidental alerts), then it can be assumed that the alert may be as a result of an external factor and that the machines themselves are operating normally. In such a case, it may be investigated whether there is an issue with the environmental control system or other system appropriate to the alerts generated and suspected external factor. If, however, the alert is generated by a machine in isolation to the rest (or by chance, in two or a small percentage of machines), then it may be determined that the issue is one internal to that machine and the proper maintenance action can be initiated (step 1250). In this way, the output of the maintenance algorithm (e.g., each alert) for each machine can be validated. Other methods, not necessarily based on alert generation, can also be used in this step. By way of example, the parameter data from each machine may be cross-correlated to determine whether an irregularity in the data is common to all machines (external influence) or occurs only in one machine (internal issue). In such an example, an event indicator may comprise a spike, a step or other irregularity in the parameter data.

If an alert/irregularity is determined to be as a result of an external factor, then this determination may be used to determine a correction as part of a feedback loop. The correction can then be applied to any control, apparatus or device which may influence the external factor. By way of example, if an alert is generated in each machine which is indicative of an environmental condition (e.g., temperature, pressure or humidity) being out of specification or otherwise impacting on the machine operation, then the correction may be applied to the environmental control. In this way, a facility such as a cleanroom facility, may comprise automatic control and adjustment of e.g., their HVAC/environmental control system to mitigate or eliminate the effect of an external influence on machine operation within the facility.

Determining the Time of an Event Indicator in Parameter Data

Features or event indicators, such as steps, in parameter data output from one or more sensors in a machine, such as a lithography apparatus, can indicate a number of events. Such events may include a change in the machine's condition or a change resulting from a deliberate maintenance action. To be able to correlate event indicators in the parameter data, it is desirable to determine the time of the occurrence of the event indicator with sufficient accuracy. If this cannot be done, it may be impossible to determine whether the event indicated by the event indicator is a consequence, or a cause, of any action performed on the machine. Moreover, the more accurately the time of a system health deviation can be determined, the sooner a maintenance engineer can be notified.

Therefore, methods are disclosed to identify event indicators, such as steps (and/or spikes), in parameter data and to provide an accurate estimate of the time that the corresponding event occurred. As discussed in relation to the "Automated Maintenance Action Detection" disclosure above, steps in parameter data are indicative of an event of note having occurred. The disclosure of this section can be used in determining the time of the step in that disclosure. The definition of a "step" may be as defined in that section. Such methods are applicable to predictive maintenance models which can predict failures in complex machines, such as lithographic apparatuses.

Parameter data may comprise a discrete time series of data values which is typically filtered prior to being used as data for predictive modelling. This filtering results in a phase delay, which causes an inaccuracy in any determination of a time for an event indicator. To mitigate this, it is proposed that the parameter data time series is also reversed in time and the same filter applied (anti-causal filtering). These two filtered time series can then be combined to find the time of any event indicators within the time series. The effect of the anti-causal filtering is to cancel the effect of the phase delay; the two time series, filtered causally and anti-causally, will have a phase delay of equal magnitude but opposite sign. Therefore an appropriate combination of these time series (e.g., an average) will cancel the phase delay.

Figure 13:
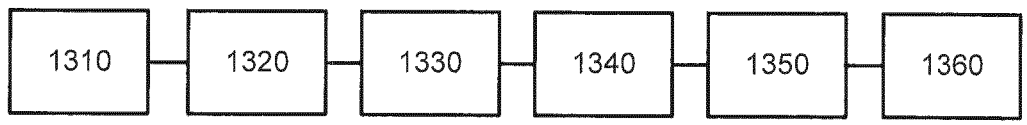
FIG. 13 is a flow diagram illustrating a method of determining the time of an event indicator in time series parameter according to an exemplary embodiment.

FIG. 13 is a flow diagram illustrating a method of attributing a time to an event indicator within a time series of parameter data according to an exemplary embodiment. The steps are as follows, and are then described in greater detail thereafter (the order of some steps may be switched):

- 1210—Obtain input parameter data from a sensor;
- 1220—Determine signal envelope of input parameter data;
- 1230—Differentiate data envelopes;
- 1240—Filter data envelope causally and anti-causally;
- 1250—Determine time of one or more spikes in the differentiated envelopes; and
- 1260—Combine the determined times of the spikes from the causally and anti-causally filtered data envelopes to determine a corrected time of the event.

At step 1210, parameter data is obtained from a sensor, and at step 1220, the signal envelope of the parameter data is determined. This will provide an enhanced contrast of one or more event indicators, such as a step, with respect to signal noise. Both the upper and lower envelope may be separately determined in this step, and separately processed in the subsequent steps.

At step 1230, the determined envelope (time series parameter data) is differentiated to obtain differentiated time series data. This differentiation produces one or more spikes which indicate an event having occurred. Steps in the original time series parameter data, following differentiation, will produce single spikes. Spikes in the original time series parameter data, following differentiation, will produce pairs of positive and negative spikes.

At step 1240, the differentiated time series data is filtered both causally and anti-causally to obtain first filtered time series data and second filtered time series data. Filtering anti-causally comprises reversing the envelope time series in time and applying the same filter as that applied to the forward time series. The filtering may comprise low pass filtering for the removal of differentiation noise.

At step 1250, a first time of a first spike (corresponding to a step in the original parameter data) is determined for the first differentiated time series data and a second time of a second spike (corresponding to the same step in the original parameter data) is determined for the second differentiated time series data. Step 1250 may also comprise identifying spikes which form one of a pair of negative and positive spikes, and therefore correspond to spikes in the original parameter data. These can then be removed or ignored, e.g., when only steps are considered to be event indicators.

At step 1260, the first time and the second time are combined to determine a corrected time, the corrected time being the actual time for the event, corrected for the phase delay caused by filtering. The corrected time, for example, may be an average of the first time and the second time.

If the corrected time of an event indicator, as determined, coincides with a known maintenance action, it might be that this can be construed as not indicating a change in the system health, depending on the type of issue. A method for determining a maintenance action is disclosed above and could be used here. Otherwise one or more event indicators might be a symptom of an event indicating a deteriorating system health. As such, an alert may be generated, or any other action initiated, as appropriate.

Model Free, Configuration Independent Fault Diagnostics

Fault diagnostics for complex systems and processes typically rely heavily on the use of graphs (such as fishbone diagrams, fault trees etc.). A graph may comprise nodes (vertices) and connectors (edges). Depending on the scope and goal, these nodes can represent, for example, any one or more of: events, parameters, processing elements, parts, and/or transfer functions. The connectors can represent relations such as any one or more of: coupling strengths, transfer probabilities, information flow, and/or causation.

Typically, three methods are employed to create such graphs. The first method is solely based on expert information. In such a method, experts create a graph based on their knowledge and experience, i.e., the graph is created with an a priori model in mind. The second method is fully data driven, for example using classical statistics, (predictive) analytics, and/or machine learning. In addition to "correlation based" analytical techniques, several methods have been developed to determine causation from data using methods such as cross-correlation function, Granger causality, etc. A third method is a hybrid of the first and second methods. The output of (one or more) data driven methods are validated and/or enriched using expert inputs.

The information that is derived from these kinds of analysis may comprise a sorted set of potential causes. The importance of a potential cause can be based on, for example, a centrality analysis; e.g., using PageRank, or degree centrality (indegree and/or outdegree) methods.

These methods have a significant limitation in that they are each essentially non-deterministic because they are not capable of distinguishing between a limited set of potential root causes. An additional problem with the hybrid method of fault diagnostics is that in a volatile ecosystem, constant "tuning" of the fault diagnostics model is required. Every time the configuration changes, the directed graph used changes: whether it be the content of the nodes, the transfer probabilities, direction of causation, etc.

Therefore, current non-deterministic fault diagnostic systems involve continuous tuning and updating. This is both labor intensive and error prone (e.g. overfitting is an issue). Many correlations between events may exist, but often only one root cause needs to be isolated.

This can lead to one or more of the following problems for hybrid fault diagnostics systems:

A continuous effort is required to maintain performance of the fault diagnostics system at an acceptable level for existing equipment. The operational costs of such a system are continuously high.

The non-deterministic nature implies that fault diagnostics is a diagnostics-by-exclusion methodology and hence inherently wasteful.

Considerable effort is needed when creating the a priori fault diagnostics model for new equipment. Also, a large organizational effort is required to align the organization for constant tuning and updating of the fault diagnostics model, as the capital expenses reoccur for every new platform.

Therefore a configuration independent fault diagnostics method is proposed. Such a method may be completely automated, from the creation of a causal graph (e.g., directed graph or digraph) to the identification of a root cause. Such a method may combine model free causation detecting methods with a data set which reflects the multi-component, hierarchical layered architecture of (for example) lithography apparatuses. This helps ensure configuration independence, but it also creates the opportunity to eliminate a sizable portion of other potential causes.

Figure 14:
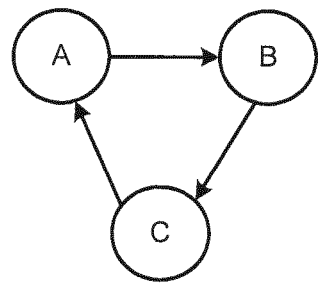
FIG. 14 is a schematic representation of a directed cycle.

In multi-layered complex systems, "directed cycles" may be observed in the directed graph representation of the causal relationships. These directed cycles indicate an intransitivity between nodes. FIG. 14 illustrates an example of such intransitivity. It shows three nodes A, B and C related by relationship R, such that node A is dependent upon node B (A R C), node B is dependent upon node C (B R C) and node C is dependent upon node A (C R A). This implies that relationship R is intransitive within the context of the cycle.

Such intransitivity can be either wanted or unwanted. However, it is believed that root causes are not intransitive in nature. Consequently, such a method may be used to exclude a large number of potential root causes and therefore more quickly and efficiently identify the actual root cause.

A directed cycle in a directed graph implies that the relation under consideration can be intransitive within the context of the directed cycle (at least). From the perspective of causality this might seem counter-intuitive: causality tends to be transitive. However, in causal reasoning, causal intransitivity is known and referred to as causal homeostasis. Causal homeostasis may describe, for example, an interlocking set of causes and effects which result in a set of properties that endure together as a stable set (or reinforcing mechanism) over time. This form of causality is used to describe certain features in complex (for example biological) systems.

The fact that intransitive unwanted directed cycles may be observed, but that root causes are not intransitive, means that potential root causes may be determined as unwanted nodes which are connected with an unwanted directed cycle, but does not form part of the unwanted directed cycle. Therefore, all nodes within the unwanted directed cycle can be dismissed as potential root causes. Of course, some directed cycles will be wanted (e.g., planned and/or desirable feedback or reinforcing mechanisms).

However, it should be appreciated that, for whatever reason, the root cause node is not present on the graph and that the unwanted directed cycle has no connected nodes (on the graph) which are not part of the cycle. In this case, the most important node in the cycle can be presumed to be the root cause node. While such a node will not actually be the root cause (being intransitive), it will help identify the actual root cause in subsequent analysis.

Where no unwanted directed cycles are found, the method may comprise presuming the root cause as either the first or the most important unwanted node on the directed graph.

Relative importance of nodes may be defined in different ways and so the method can depend on the scope and context of the application. For example, a centrality analysis may be used to determine the most important node. Any suitable centrality metric or method can be employed.

The proposed method comprises the following main stages—1) determine causal relationships as a directed graph, 2) determine any directed cycles, 3) determine whether the directed cycles are wanted or unwanted (or if no directed cycles are determined identify unwanted nodes) and 4) determine root cause.

The determination as to whether a directed cycle, or a node, is wanted or unwanted can be performed in a number of ways. However, the determination should be such that it can be automated. For example, a determination may be made based on the health characteristics represented by the node or directed cycle. For example, where the node relates to a particular parameter, an unwanted node may be one where the value of that parameter is out of specification, and a wanted node may be one where the value of that parameter is within specification. A specific example of this may be, where the node is a power level of a particular element, determining a node as wanted if the power level is within specification and unwanted if the power level is out of specification. An unwanted directed cycle may comprise a directed cycle comprising one or more unwanted nodes, or which describes an unwanted reinforcing or feedback mechanism. Depending on the scope and context, other methods for a posteriori determining whether a node/cycle is unwanted could be applied. Also, the determination need not be binary, but instead may be continuous or have a greater resolution, depending on the scope and goal.

In an embodiment, whether a directed cycle or node is wanted or unwanted can be represented on the graph in a number of ways, for example by being represented in different colors.

It is proposed that the determination of causal relationships also be automated. In an embodiment, this may be done using the method of identifying causal relationships using transfer entropy described above, and the disclosure of that section should be understood as being applicable to the methods of this section.

In an embodiment, the data may initially be context filtered before performing the step of determining causal relationships. This may further aid in the determination of wanted and unwanted nodes and cycles. The context filtering may be employed to ensure that only data generated during a "down" state is used, (e.g., where the (high level) behavior of the equipment is unwanted). This type of automated context filtering may be as described above in the section titled Context Determination. The disclosure of that section should be understood as being applicable to the methods of this section. In addition to the context filtering, further filtering may be performed such that only indicators related to a down state (errors or alarms) are used, and events and warnings are excluded.

Figure 15:
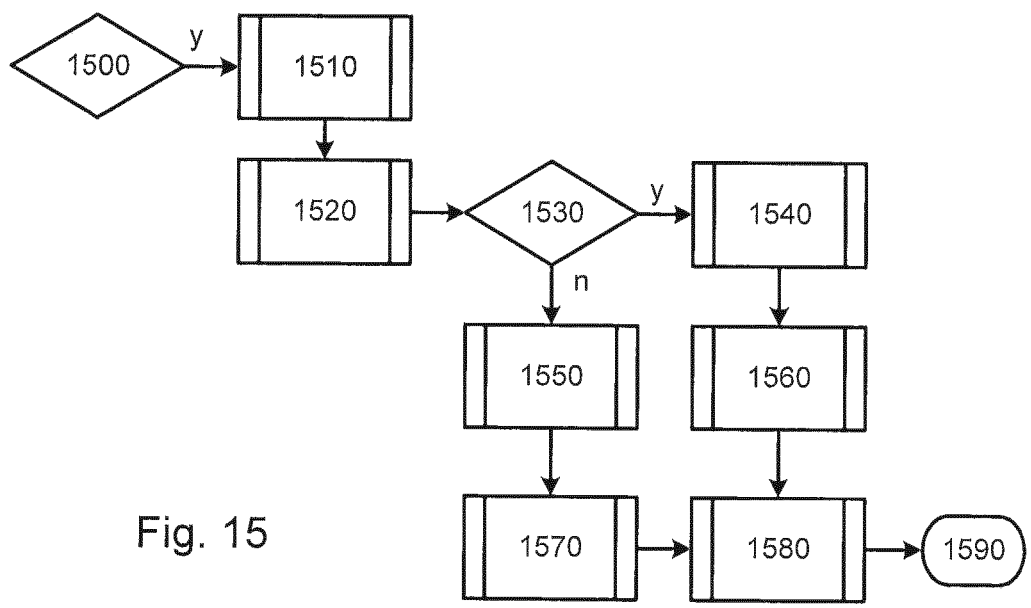
FIG. 15 is a flow diagram illustrating a method of performing model free, configuration independent fault diagnostics according to an exemplary embodiment.

FIG. 15 is a flow diagram illustrating a method of performing model free, configuration independent fault diagnostics according to an exemplary embodiment. The steps are as follows, and are then described in greater detail thereafter:

1500—Context filtering
1510—Generate causal digraph
1520—Identify cycles
1530—Cycles found?
1540—Classify cycles/nodes
1550—Classify nodes
1560—Determine most important node leading to unwanted cycle/part of unwanted cycle
1570—Determine most important node/first node
1580—Determine root cause
1590—End An optional initial step of context filtering 1500 may be performed on the input data describing the events. This step may use the context determination technique described above and illustrated in FIGS. 4 and 5. For example, all data other than that relating to a down state may be filtered out. Data which does not relate to errors or alarms may also be filtered out at this stage. The data fulfilling the context criteria is then used to generate a causal directed graph 1510. This may be done using the method illustrated in FIG. 9, or any of the methods of identifying causal relationships using transfer entropy disclosed in the accompanying section. At step 1520 the directed graph is examined to identify any directed cycles. At step 1530 a determination is made as to whether any directed cycles are present. If directed cycles are present, the directed cycles (and the nodes) are classified at step 1540. This may comprise determining whether the directed cycles and nodes are wanted or unwanted. Non-binary categorization is also possible (e.g., an indication of the degree by which a directed cycle is wanted/unwanted). On the directed graph, wanted and unwanted cycles/nodes may be represented differently, e.g., by different colors. At 1560, the unwanted node (or where there are more than one, the most important unwanted node), which is connected to (e.g., leading into), but not part of, an unwanted directed cycle is identified. If there is no such unwanted node, then the most important unwanted node forming part of the unwanted directed cycle is identified. At step 1580, the identified node is determined to be the root cause node.

If at step 1530, it is determined that no directed cycles are present, then the nodes are classified at step 1550. This may comprise determining whether the nodes are wanted or unwanted. Non-binary categorization is also possible (e.g., an indication of the degree by which a node is wanted/unwanted). On the directed graph, wanted and unwanted nodes may be represented differently, e.g., by different colors. At step 1570, the most important unwanted node, or alternatively the first unwanted node is identified and at step 1580, this identified node is determined to be the root cause node.

Advantages of such methods as disclosed in this section may include, for example:

Low operational expenses: no a priori or a posteriori expert knowledge is required, and no continuous tuning is required;

No recurring capital expenses: the only requirements to apply the method for new machines are data availability; and/or Methods uses causality and not correlation as the main identifier for possible causes, and it excludes potential causes that reside within directed cycles. This implies a reduction in diagnostic steps. Diagnostics time will be reduced as compared to essential non-deterministic methods.

The present disclosure further comprises the following aspects, presented as numbered clauses:

1. A method of identifying causal relationships between pairs of time series, each pair of time series corresponding to a different pair of parameters of a lithographic apparatus, each time series comprising multiple samples of a different one of the parameters, the method comprising:
  determining a value for transfer entropy for each of the pairs of time series; and
  using the values for transfer entropy to identify causal relationships between the pairs of time series.
2. The method according to clause 1, wherein the values for transfer entropy are determined and the causal relationships defined for each of the pairs of time series in both directions.
3. The method according to clause 1 or clause 2, wherein the values for transfer entropy are determined for each of the pairs of time series, for a plurality of different time lags, wherein time lag is a measure of the time interval over which the transfer entropy is measured.
4. The method according to any preceding clause, wherein statistical significance of each transfer entropy value is evaluated by comparing the determined transfer entropy value to a significance threshold value indicative of that which would occur through random chance; and
  attributing a causal relationships to only those pairs of time series for which the transfer entropy value is above its significance threshold value.
5. The method according to clause 4, comprising shuffling the time series in time, determining surrogate transfer entropy values for each pair of shuffled time series and using the surrogate transfer entropy values as references in determining the significance threshold value.
6. The method according to any preceding clause, comprising:
  determining a synchronization ratio for each determined transfer entropy value, the synchronization ratio being the ratio of the transfer entropy value to a mutual information value for the corresponding pairs of time series; and
  categorizing each identified causal relationship using the synchronization ratio.
7. The method according to clause 6, wherein, for transfer entropy values which are evaluated as being statistically significant, the corresponding causal relationship is considered to represent a feedback dominated information flow if the synchronization ratio is less than 1 and a forcing dominated information flow if the synchronization ratio is greater than 1.
8. The method according to any preceding clause, comprising using the determined transfer entropies and identified causal relationships to determine a process network, wherein each of the parameters is a node in the process network, the connections between nodes being dependent upon the determined transfer entropies.
9. The method according to clause 8, comprising determining a causal matrix wherein each cell of the causal matrix indicates whether there is a directional causal relationship between two nodes.
10. The method according to clause 9, wherein a characteristic time lag is determined for each pair of parameters, in each direction, to reduce dimensionality of the causal matrix.
11. The method according to clause 10, wherein the characteristic time lag is a first time lag for which the corresponding determined transfer entropy is evaluated to be statistically significant.
12. The method according to clause 10, wherein the characteristic time lag is the time lag for which the corresponding determined transfer entropy is highest.
13. The method according to any of clauses 9 to 12, wherein the causal matrix is displayed as a circular directional chart, a bubble chart and/or a heat map.
14. The method according to any of clauses 8 to 13, comprising performing a network centrality analysis to rank the process network nodes, and/or the corresponding parameters, in terms of their impact on the network.
15. The method according to clause 14, comprising using the ranking of the process network nodes to map information flows from a fault to a failure within the lithographic apparatus.
16. The method according to any preceding clause, wherein the parameters comprise parameters recorded in an event log of the lithographic apparatus.
17. A method of modelling a system and/or process, the method comprising:
  obtaining parameter data relating to the system and/or process;
  determining context data relating to a context in which the system and/or process is operating from the parameter data, wherein the system and/or process is operable in at least one of a plurality of contexts at any one time; and
  applying a quality weighting to the context data, the quality weighting being dependent upon a measure of the accuracy of the context data for a particular context segment, each context segment comprising a segment of one of the contexts, wherein each context is segmented temporally.
18. The method according to clause 17, wherein the measure of the accuracy of the context data for a particular context segment has been previously determined for each possible context segment for the system and/or process.
19. The method according to clause 18, wherein the measure of the accuracy of the context data for a particular context segment has additionally been previously determined for each possible context transition, for each of the possible context segments.
20. The method according to any of clauses 17 to 19, wherein the context segments comprise intermediate segments and transitional segments, such that each context comprises two transitional segments and an intermediate segment there between.
21. The method according to any of clauses 17 to 20, wherein the quality weighting is applied to each context segment of the context data in dependence upon the context segment.
22. The method according to clause 21, wherein the quality weighting is applied to each context segment of the context data in further dependence of the preceding and/or succeeding context segment.
23. The method according to any of clauses 17 to 22, wherein the quality weighting determines the degree of consideration accorded to the context data and/or the parameter data to which the context data corresponds in the modelling of the system and/or process.
24. The method according to clause 23, wherein the quality weighting is binary such that the context data and/or the parameter data to which the context data corresponds is weighted to be either included or not included in the modelling of the system and/or process.
25. The method according to any of clauses 17 to 24, wherein the context comprises an operational mode or operational state of the system and/or process.
26. The method according to any of clauses 17 to 25, wherein the system and/or process is a lithographic system and/or process.

27. A method of monitoring a system and/or process, the method comprising:
    monitoring one or more system and/or process parameter values over time;
    determining whether there is a step in the one or more system and/or process parameter values;
    responsive to such a step being detected, determining whether there is an increase in process capability subsequent to the step; and
    responsive to an increase in process capability being detected subsequent to a step, attributing this to a maintenance action having been performed on the system and/or process.
28. The method according to clause 27, wherein the step in the one or more system and/or process parameter values is a persistent step in the parameter values.
29. The method according to clause 27 or clause 28, wherein the determining whether there is an increase in process capability comprises measuring the process capability of the system and/or process before the step and after the step and comparing these measurements.
30. The method according to any of clauses 27 to 29, wherein the process capability is measured in terms of process capability index $C_{pk}$.
31. The method according to clause 30, wherein the process capability index $C_{pk}$ is a one-sided process capability index $C_{pk}$
32. The method according to any of clauses 27 to 31 comprising:
    initially performing the method according to any of clauses 17 to 25;
    applying the quality weighting to the system and/or process parameter values; and
    according a degree of consideration to the system and/or process parameter values based on the quality weighting.
33. The method according to any of clauses 27 to 32, comprising resetting related model algorithms modelling the system and/or process responsive to a determination that a maintenance action is being performed.
34. The method according to any of clauses 27 to 33, wherein the system and/or process is a lithographic system and/or process.
35. The method according to any of clauses 27 to 34 comprising performing the method of any of clauses 80 to 87 to determine the time of the step, the step comprising the event indicator of clauses 80 to 87.
36. A method of management of unattended alerts generated by a model, the model modelling a system and/or process, the method comprising:
    obtaining a cost metric relating to a measure of a cost of attending to each alert generated;
    obtaining a benefit metric relating to a measure of a benefit in attending to each alert generated as a function of time; and
    performing a management action on the unattended alerts based on an evaluation of the benefit metric against the cost metric for each alert.
37. The method according to clause 36, wherein the management action comprises assigning an alert expiry time to each of the unattended alerts based upon the evaluation of the benefit metric against the cost metric appropriate for each alert.
38. The method according to clause 37, wherein the alert expiry time is based on a time for which evaluation of the benefit metric against the cost metric meets a threshold value.
39. The method according to any of clauses 36 to 38, comprising automatically expiring unattended alerts at their alert expiry time.
40. The method according to any of clauses 36 to 39, wherein the alert expiry times are displayed to a user.
41. The method according to any of clauses 36 to 40, wherein the management action comprises determining a priority metric for each of the unattended alerts based upon the evaluation of the benefit metric against the cost metric appropriate for each alert, the priority metric being a measure of the instantaneous impact of attention to each unattended alert.
42. The method according to clause 41, wherein the priority metrics are referenced relative to a reference priority metric, the reference priority metric being the priority metric determined to represent the greatest instantaneous impact at the time the corresponding alert is generated.
43. The method according to clause 41 or clause 42, wherein the measure of the instantaneous impact of attention to each unattended alert comprises a measure of the impact of a proactive action assuming an immediate proactive action after a particular time multiplied by the probability of instantaneous failure after the particular time.
44. The method according to any of clauses 41 to 43, wherein a priority ranking is assigned to each alert based upon its priority metric.
45. The method according to clause 44, wherein the priority ranking is on a logarithmic scale.
46. The method according to clause 44 or clause 45, wherein the priority metrics and priority rankings are recalculated periodically for all unattended alerts.
47. The method according to any of clauses 44 to 46, wherein the priority rankings and/or the priority metrics are displayed to a user.
48. The method according to any of clauses 36 to 47, wherein the cost metric is derived from known information relating to the costs of attending to each alert.
49. The method according to clause 48, wherein the costs comprise costs related to one or more selected from: system and/or process downtime, reduced productivity, financial cost and/or resource utilization.
50. The method according to any of clauses 36 to 49, wherein the benefit metric is obtained from a failure probability distribution describing the probability of failure over time during which an alert is unattended following generation of the alert.
51. The method according to clause 50, wherein the benefit metric is a measure of the downtime reduction potential derived from the failure probability distribution.
52. The method according to clause 50 or clause 51, wherein the failure probability distribution for each alert is obtained from model test data comparing the results of model predictions to corresponding known history of the modelled system and/or process.
53. The method according to any of clauses 36 to 52, wherein the system and/or process is a lithographic system and/or process.
54. A method of representing a system, the method comprising:
    showing elements of the system and the relationships between the elements;
    showing, for at least some of the elements, properties which affect operation of that element; and
    showing, for at least some of the relationships between the elements, parameters relevant to that relationship.
55. The method according to clause 54, wherein the system is shown in terms of an objective.

56. The method according to clause 55, wherein the properties and parameters are those relevant for achieving the objective.
57. The method according to any of clauses 54 to 57, wherein the parameters relevant to a relationship are parameters relating to an output of a first element of the relationship, which affects operation of a second element of the relationship.
58. The method according to any of clauses 54 to 57, further comprising showing facilities from which one or more of the elements are supplied.
59. The method according to any of clauses 54 to 58, further comprising showing statuses for at least some of the properties and/or parameters.
60. The method according to clause 59, wherein the statuses are shown in real time.
61. The method according to clause 59 or clause 60, wherein the statuses indicate that a parameter is within specification, not within specification or unknown.
62. The method according to clause 61, wherein statuses shown as not within specification are linked to an instruction for addressing the cause of the status.
63. The method according to any of clauses 54 to 62, wherein the system is represented at a plurality of levels, such that one or more of the elements is the subject of a further representation in terms of its sub-elements.
64. A method of performing diagnostics on a system, the method comprising performing the method of any of clauses 54 to 63 to obtain a representation of the system and using the representation of the system in performing system diagnostics.
65. A method of determining whether an event recorded in parameter data is attributable to an external factor, the method comprising:
    obtaining plural equivalent sets of parameter data, the equivalent sets of parameter data being each obtained from equivalent sensors of a plurality of apparatuses within a same location and over the same time period;
    combining the equivalent sets of parameter data;
    determining whether there are coincident event indicators in the equivalent sets of parameter data; and
    attributing events as being caused by an external factor if there are coincident event indicators in a threshold number of equivalent sets of parameter data.
66. The method according to clause 65, wherein the plurality of apparatuses comprise a plurality of lithographic apparatuses.
67. The method according to clause 65 or clause 66, wherein the location comprises a room, building or site.
68. The method according to clause 67, wherein the location comprises a cleanroom.
69. The method according to any of clauses 65 to 68, wherein the event indicators are alerts.
70. The method according to clause 69, wherein the alerts are generated by predictive maintenance models.
71. The method according to any of clauses 65 to 70, wherein the threshold number comprises all of the equivalent sets of parameter data, such that there are coincident event indicators in each of the equivalent sets of parameter data.
72. The method according to any of clauses 65 to 70, wherein the threshold number comprises 90% of the equivalent sets of parameter data, such that there are coincident event indicators in each of 90% of the equivalent sets of parameter data.
73. The method according to any of clauses 65 to 72, wherein coincident event indicators are event indicators that are each comprised in a different one of the equivalent sets of parameter data and which occur within the same time period.
74. The method according to any of clauses 65 to 73, wherein, if an event indicator is determined as occurring in only one of the equivalent sets of parameter data, or below a threshold number of equivalent sets of parameter data, determining that the event is caused by a factor internal to the apparatus(es) corresponding to the event indicator(s).
75. The method according to clause 74, comprising scheduling a maintenance action for the apparatus(es) corresponding to the event indicator(s).
76. The method according to any of clauses 65 to 73, comprising, where events are attributed as being caused by an external factor, scheduling a maintenance action on a system controlling the external factor.
77. The method according to any of clauses 65 to 73, comprising, where events are attributed as being caused by an external factor,
    calculating a correction for a system controlling the external factor, and
    applying the correction to the control of the system so as to mitigate the effect of the external factor.
78. The method according to clause 76 or clause 77, wherein the external factor is an external environmental factor and the system is an environmental control system.
79. The method according to clause 78, wherein the external environmental factor comprises atmospheric pressure, humidity and/or temperature.
80. A method of determining the time of an event indicator in time series parameter data, the method comprising:
    applying a causal filter to the time series parameter data to obtain first filtered time series data;
    applying an anti-causal filter to the time series parameter data to obtain second filtered time series data; and
    combining the first filtered time series data and the second filtered time series data to determine a corrected time for an event indicator within the parameter data.
81. The method according to clause 80, wherein the event indicator comprises a step in the time series parameter data.
82. The method according to clause 80 or clause 81, wherein applying the anti-causal filter comprises:
    reversing the time series parameter data in time, and
    applying the causal filter to the reversed time series parameter data.
83. The method according to any of clauses 80 to 82, comprising a prior step of determining a signal envelope of input parameter data such that the time series parameter data describes the signal envelope.
84. The method according to clause 83, wherein determining the signal envelope comprises determining an upper envelope and a lower envelope, the method being performed separately for each of the upper envelope and lower envelope.
85. The method according to any of clauses 80 to 84, comprising:
    determining a first time for the event indicator within the first filtered time series data; and
    determining a second time for the event indicator within the second filtered time series data, wherein the combining the first filtered time series data and the second filtered time series data comprises combining the first time and the second time to obtain the corrected time.

86. The method according to clause 85, wherein combining the first time and the second time comprises obtaining an average of the first time and the second time to obtain the corrected time.
87. The method according to clause 85 or clause 86, comprising, prior to determining the first time and the second time, differentiating the time series parameter data, such that the event indicators form spikes in the differentiated time series parameter data, wherein the first time comprises the time corresponding to a first of the spikes in the first filtered time series data, and the second time comprises the time corresponding to a second of the spikes in the second filtered time series data, the first spike and second spike corresponding to the same event indicator.
88. The method according to clause 87, comprising:
    identifying the spikes which comprise one of a pair of positive and negative spikes; and
    determining these spikes to not correspond to an event indicator.
89. The method according to any of clauses 80 to 88, comprising determining whether the corrected time coincides with a maintenance action and if so, assuming that the maintenance action is the cause of the event indicator corresponding to the corrected time.
90. The method according to clause 89, comprising, where it is determined that the corrected time does not coincide with a maintenance action, generating an alert.
91. The method according to clause 89 or clause 90, wherein determining whether the corrected time coincides with a maintenance action comprises performing the method of any of clauses 27 to 35 to determine whether a maintenance action has been performed.
92. A method of classifying an event associated with a fault condition occurring within a system, the method comprising:
    determining causal relationships between a plurality of events associated with the system;
    identifying one or more directed cycles within the plurality of events and the causal relationships;
    classifying a directed cycle based on a nominal system behavior; and
    classifying one or more event(s) having a causal relation to the classified directed cycle based on the cycle classification.
93. The method according to clause 92, wherein the classifying one or more event(s) comprises classifying one or more of the plurality of events as a root cause event for the fault condition.
94. The method according to clause 93, wherein the classifying one or more of the plurality of events as a root cause event comprises classifying one or more of the events which have a causal relationship with a classified directed cycle, but which are not comprised within the classified directed cycle, as a root cause event.
95. The method according to clause 93 or clause 94, wherein the classifying a directed cycle comprises determining whether the directed cycle is wanted or unwanted.
96. The method according to clause 95, wherein the determining whether the directed cycle is wanted or unwanted comprises determining whether an aspect of operation of the system described by the directed cycle is within a specified margin with reference to the nominal system behavior.
97. The method according to clause 95 or clause 96, comprising determining the root cause event as an event having a causal relationship with a classified unwanted directed cycle, but not comprised within the classified unwanted directed cycle.
98. The method according to any of clauses 95 to 97, wherein, should there be no event having a causal relationship with a classified unwanted directed cycle, but not comprised within the classified unwanted directed cycle, determining the root cause event as the most important event within the classified unwanted directed cycle.
99. The method according to any of clauses 95 to 98, further comprising classifying the events.
100. The method according to clause 99, wherein classifying the events comprises determining whether an event is wanted or unwanted.
101. The method according to clause 100, wherein the root cause event is further determined to be an unwanted event.
102. The method according to clause 101, wherein, where no unwanted directed cycles are identified, determining the root cause event to be the most important and/or first unwanted event.
103. The method according to any of clauses 92 to 102, wherein the determining causal relationships comprises performing the method of any of clauses 1 to 16.
104. The method according to any of clauses 92 to 103, further comprising context filtering the data describing the plurality of events prior to the determining causal relationships.
105. The method according to clause 104, wherein the context filtering the data comprises performing the method of any of clauses 17 to 26.
106. The method according to any of clauses 92 to 105, wherein each step of the method is automated.
107. A lithographic apparatus comprising:
    an illumination optical system arranged to illuminate a pattern; and
    a projection optical system arranged to project an image of the pattern onto a substrate,
    wherein the lithographic apparatus is arranged to perform the method of any of clauses 17 to 26 to model operation of the lithographic apparatus, the parameter data and context data relating to the lithographic apparatus.
108. The lithographic apparatus according to clause 107, wherein the contexts are operational states of the lithographic apparatus.
109. A lithographic apparatus comprising:
    an illumination optical system arranged to illuminate a pattern; and
    a projection optical system arranged to project an image of the pattern onto a substrate,
    wherein the lithographic apparatus is arranged to perform the method of any of clauses 27 to 35 to monitor operation of the lithographic apparatus, the system and/or process comprising the lithographic apparatus, the system and/or process parameters data comprising parameters of the lithographic apparatus.
110. The lithographic apparatus according to clause 108 being further operable to perform the method of any of clauses 80 to 87 to determine the time of the step detected.
111. A lithographic apparatus comprising:
    an illumination optical system arranged to illuminate a pattern; and
    a projection optical system arranged to project an image of the pattern onto a substrate,
    wherein the lithographic apparatus is arranged to run a model modelling its own operation, and perform the method of any of clauses 36 to 53 to manage unattended alerts generated by the model.
112. A lithographic apparatus comprising:
an illumination optical system arranged to illuminate a pattern; and
a projection optical system arranged to project an image of the pattern onto a substrate,
wherein the lithographic apparatus is arranged to identify causal relationships between pairs of time series, each pair of time series corresponding to a different pair of parameters of the lithographic apparatus, by performing the method of any of clauses 1 to 16.
113. A lithographic apparatus comprising:
an illumination optical system arranged to illuminate a pattern; and
a projection optical system arranged to project an image of the pattern onto a substrate,
wherein the lithographic apparatus is configured to run a model modelling its own operation, and perform the method of any of clauses 80 to 91 to determine the time of an event indicator in time series parameter data related to the model.
114. A lithographic apparatus comprising:
an illumination optical system arranged to illuminate a pattern; and
a projection optical system arranged to project an image of the pattern onto a substrate,
wherein the lithographic apparatus is arranged to classify an event associated with a fault condition occurring within the lithographic apparatus by performing the method of any of clauses 92 to 106.
115. A plurality of lithographic apparatuses; and a controller configured to perform the method of any of clauses 65 to 79, wherein each set of the equivalent sets of parameter data is generated from one of the lithographic apparatuses.
116. A computer program comprising processor readable instructions which, when run on a suitable processor controlled apparatus, cause the processor controlled apparatus to perform the method of any of clauses 1 to 106.
117. A computer program carrier comprising the computer program of clause 116.
118. A method of manufacturing devices wherein a device pattern is applied to a series of substrates using a lithographic process, the method comprising:
using the method of any of clauses 1 to 16 to identify causal relationships between pairs of time series, each pair of time series corresponding to a different pair of parameters of the lithographic process.
119. A method of manufacturing devices wherein a device pattern is applied to a series of substrates using a lithographic process, the method comprising:
using the method of any of clauses 17 to 26 to model the lithographic process, and
using an output of the model to control the lithographic process.
120. A method of manufacturing devices wherein a device pattern is applied to a series of substrates using a lithographic process, the method comprising using the method of any of clauses 27 to 35 to monitor the lithographic process.
121. A method of manufacturing devices wherein a device pattern is applied to a series of substrates using a lithographic process, the method comprising:
using the method of any of clauses 36 to 53 to manage unattended alerts generated by a model of the lithographic process, and
using an output of the model to control the lithographic process.
122. A method of manufacturing devices wherein a device pattern is applied to a series of substrates using a lithographic process performed on a plurality of lithographic apparatuses, the method comprising:
using the method of any of clauses 65 to 79 to determine whether an event recorded in parameter data is attributable to an external factor, and
using the determination to control the lithographic process.
123. A method of manufacturing devices wherein a device pattern is applied to a series of substrates using a lithographic process, the method comprising:
running a model modelling operation of the lithographic process; and
performing the method of any of clauses 80 to 91 to determine the time of an event indicator in time series parameter data related to the model.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments fully reveals the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of classifying an event associated with a fault condition occurring within a system, the method comprising:
determining causal relationships between a plurality of events associated with the system;
identifying, by a hardware computer system, one or more directed cycles within the plurality of events and the causal relationships;
classifying a directed cycle based on a nominal system behavior; and
classifying one or more event(s) having a causal relation to the classified directed cycle based on the cycle classification; and
correcting, optimizing or otherwise configuring the system based on the classified one or more event(s) and/or providing a signal representing, or based on, the classified one or more event(s) to a tool or the system for use by the tool or the system in correction, optimization or other configuration of the system.

2. The method as claimed in claim 1, wherein the classifying one or more event(s) comprises classifying one or more of the plurality of events as a root cause event for the fault condition.

3. The method as claimed in claim 2, wherein the classifying one or more of the plurality of events as a root cause event comprises classifying one or more of the events which have a causal relationship with a classified directed cycle, but which are not comprised within the classified directed cycle, as a root cause event.

4. The method as claimed in claim 2, wherein the classifying a directed cycle comprises determining whether the directed cycle is wanted or unwanted.

5. The method as claimed in claim 4, wherein the determining whether the directed cycle is wanted or unwanted comprises determining whether an aspect of operation of the system described by the directed cycle is within a specified margin with reference to the nominal system behavior.

6. The method as claimed in claim 4, comprising determining the root cause event as an event having a causal relationship with a classified unwanted directed cycle, but not comprised within the classified unwanted directed cycle.

7. The method as claimed in claim 4, wherein, responsive to there being no event having a causal relationship with a classified unwanted directed cycle, but not comprised within the classified unwanted directed cycle, determining the root cause event as the most important event within the classified unwanted directed cycle.

8. The method as claimed in claim 1, further comprising context filtering the data describing the plurality of events prior to the determining causal relationships.

9. The method as claimed in claim 8, wherein the context filtering the data comprises:
obtaining parameter data relating to a system and/or process;
determining context data relating to a context in which the system and/or process is operating from the parameter data, wherein the system and/or process is operable in at least one of a plurality of contexts at any one time; and
applying a quality weighting to the context data, the quality weighting being dependent upon a measure of the accuracy of the context data for a particular context segment, each context segment comprising a segment of one of the contexts, wherein each context is segmented temporally.

10. The method as claimed in claim 5, further comprising classifying the events.

11. The method as claimed in claim 10, wherein classifying the events comprises determining whether an event is wanted or unwanted.

12. The method as claimed in claim 11, wherein the root cause event is further determined to be an unwanted event.

13. The method as claimed in claim 12, wherein, responsive to no unwanted directed cycles being identified, determining the root cause event to be the most important and/or first unwanted event.

14. The method as claimed in claim 1, wherein the determining causal relationships comprises using a method of identifying causal relationships between pairs of time series, each pair of time series corresponding to a different pair of parameters of a lithographic apparatus, each time series comprising multiple samples of a different one of the parameters, the method of identifying causal relationships comprising:
determining a value for transfer entropy for each of the pairs of time series; and
using the values for transfer entropy to identify causal relationships between the pairs of time series.

15. The method as claimed in claim 1, wherein each step of the method is automated.

16. A lithographic apparatus comprising:
an illumination optical system arranged to illuminate a pattern; and
a projection optical system arranged to project an image of the pattern onto a substrate,
wherein the lithographic apparatus is arranged to classify an event associated with a fault condition occurring within the lithographic apparatus, the lithographic apparatus comprising computer-readable instructions configured to cause performance of the method of claim 1.

17. A computer program product comprising a non-transitory computer-readable medium comprising processor readable instructions therein, which instructions, when run on a suitable processor controlled apparatus, cause the processor controlled apparatus to at least:
determine causal relationships between a plurality of events associated with a system;
identify one or more directed cycles within the plurality of events and the causal relationships;
classify a directed cycle based on a nominal system behavior;
classify one or more event(s) associated with a fault condition occurring within the system and having a causal relation to the classified directed cycle, based on the cycle classification; and
correct, optimize or otherwise configure the system based on the classified one or more event(s) and/or provide a signal representing, or based on, the classified one or more event(s) to a tool or system for use by the tool or system in correction, optimization or other configuration of the system.

18. A method of identifying causal relationships between pairs of time series, each pair of time series corresponding to a different pair of parameters of a lithographic apparatus, each time series comprising multiple samples of a different one of the parameters, the method comprising:
determining, by a hardware computer system, a value for transfer entropy for each of the pairs of time series;
evaluating statistical significance of each transfer entropy value by comparing the determined transfer entropy value to a significance threshold value indicative of that which would occur through random chance;
using the values for transfer entropy to identify causal relationships between the pairs of time series, wherein a causal relationship is attributed to only those pairs of time series for which the transfer entropy value is above its significance threshold value; and
correcting, optimizing or otherwise configuring the lithographic apparatus or a process involving the lithographic apparatus based on the identified causal relationships and/or providing a signal representing, or based on, the identified causal relationships to a tool or a system for use by the tool or system in correction, optimization or other configuration of the lithographic apparatus or a process involving the lithographic apparatus.

19. The method as claimed in claim 18, comprising shuffling the time series in time, determining surrogate transfer entropy values for each pair of shuffled time series and using the surrogate transfer entropy values as references in determining the significance threshold value.

20. A computer program product comprising a non-transitory computer-readable medium comprising processor readable instructions therein, which instructions, when run on a suitable processor controlled apparatus, cause the processor controlled apparatus to at least:
- determine a value for transfer entropy for each of a plurality of pairs of time series, each pair of time series corresponding to a different pair of parameters of a lithographic apparatus, each time series comprising multiple samples of a different one of the parameters;
- evaluate statistical significance of each transfer entropy value by comparison of the determined transfer entropy value to a significance threshold value indicative of that which would occur through random chance;
- use the values for transfer entropy to identify causal relationships between the pairs of time series, wherein a causal relationship is attributed to only those pairs of time series for which the transfer entropy value is above its significance threshold value; and
- correct, optimize or otherwise configure the lithographic apparatus or a process involving the lithographic apparatus based on the identified causal relationships and/or provide a signal representing, or based on, the identified causal relationships to a tool or a system for use by the tool or system in correction, optimization or other configuration of the lithographic apparatus or a process involving the lithographic apparatus.

* * * * *